(12) United States Patent
Ikeda et al.

(10) Patent No.: US 7,872,476 B2
(45) Date of Patent: Jan. 18, 2011

(54) NMR PROBE

(75) Inventors: Hiroshi Ikeda, Tokyo (JP); Yoshiki Kida, Tokyo (JP); Hiroto Suematsu, Tokyo (JP)

(73) Assignee: JEOL Ltd., Tokyo (JP)

( * ) Notice: Subject to any disclaimer, the term of this patent is extended or adjusted under 35 U.S.C. 154(b) by 149 days.

(21) Appl. No.: 12/423,210

(22) Filed: Apr. 14, 2009

(65) Prior Publication Data

US 2009/0261829 A1      Oct. 22, 2009

(30) Foreign Application Priority Data

Apr. 16, 2008   (JP)   ............... 2008-106272
Feb. 12, 2009   (JP)   ............... 2009-029473

(51) Int. Cl.
   *G01V 3/00*   (2006.01)
(52) U.S. Cl. ........................ 324/322; 324/318
(58) Field of Classification Search ........... 324/322, 324/318, 321
   See application file for complete search history.

(56) References Cited

U.S. PATENT DOCUMENTS

| | | | |
|---|---|---|---|
| 5,243,289 A * | 9/1993 | Blum et al. ............ | 324/322 |
| 6,307,371 B1 | 10/2001 | Zeiger | |
| 6,653,836 B2 * | 11/2003 | Hasegawa ............ | 324/322 |
| 6,686,741 B2 * | 2/2004 | Hasegawa ............ | 324/322 |
| 6,933,725 B2 * | 8/2005 | Lim et al. ............ | 324/322 |
| 7,352,185 B1 | 4/2008 | Zens et al. | |
| 7,714,581 B2 * | 5/2010 | Erickson et al. ....... | 324/322 |
| 7,808,242 B2 * | 10/2010 | Yamamoto et al. ...... | 324/318 |

FOREIGN PATENT DOCUMENTS

| | | |
|---|---|---|
| JP | 2002-372575 | 12/2002 |
| JP | 2003-121523 | 4/2003 |

* cited by examiner

*Primary Examiner*—Louis M Arana
(74) *Attorney, Agent, or Firm*—The Webb Law Firm

(57) ABSTRACT

An NMR probe is offered which enables a $^1H/^{19}F$ compatibility mode having a sample coil, a hollow tubular body, and two rod electrodes disposed inside the tubular body substantially in a parallel relationship to each other. The tubular body is formed by a conductive wall at ground potential. An RF input-output portion corresponding to the resonant frequency of $^1H$ nucleus is connected with the one end of the coil via a tuning and matching device. Another RF input-output port corresponding to the resonant frequency of $^{19}F$ nucleus is connected with an end of the coil via another tuning and matching device.

11 Claims, 18 Drawing Sheets

RESONANT FREQUENCY AT 18 TESLA

| NUCLEAR SPECIES | RESONANT FREQUENCY | NUCLEAR SPECIES | RESONANT FREQUENCY | NUCLEAR SPECIES | RESONANT FREQUENCY |
|---|---|---|---|---|---|
| $^3$H | 800 | $^{27}$Al | 195 | $^{15}$N | 76 |
| $^1$H | 750 | $^{13}$C | 189 | $^{35}$Cl | 74 |
| $^{19}$F | 706 | $^{79}$Br | 188 | $^{14}$N | 54 |
| $^{205}$Tl | 433 | $^{29}$Si | 149 | $^{39}$K | 35 |
| $^{31}$P | 304 | $^{199}$Hg | 134 | $^{99}$Ru | 35 |
| $^7$Li | 292 | $^2$H | 115 | $^{183}$W | 31 |
| $^{119}$Sn | 280 | $^6$Li | 110 | $^{103}$Rh | 24 |
| $^{11}$B | 241 | $^{17}$O | 102 | | |

L : ~140
Ew : 28
Eh : 28
X : ~6
Y : ~14
D1 : ~3
D2 : ~11
S : ~14
[mm]

B1: SIMULTANEOUS COEXISTENCE OF FH FREQUENCIES
B2: LF FREQUENCY
B3: LOCK FREQUENCY

B1: LF FREQUENCY (ex. $^{31}P \sim ^{15}N$, etc.
B2: SIMULTANEOUS COEXISTENCE OF FH FREQUENCIES
B3: LOCK FREQUENCY

NMR PROBE

BACKGROUND OF THE INVENTION

1. Field of the Invention

The present invention relates to an NMR probe for use in an NMR spectrometer and, more particularly, to an NMR probe permitting observation and irradiation of two nuclear species which are close in resonant frequency.

2. Description of Related Art

An NMR spectrometer is an instrument for analyzing a molecular structure by irradiating a sample placed within a static magnetic field with RF radiation, then detecting a feeble RF signal (NMR signal) emanating from the sample, and extracting information about the molecular structure contained in the signal.

FIG. 1 is a schematic block diagram of the NMR spectrometer. The spectrometer has an RF oscillator 1 producing an RF signal. The RF signal is controlled in terms of phase and amplitude by a phase controller 2 and an amplitude controller 3 and sent to a power amplifier 4.

The RF signal is amplified to an electric power necessary to excite an NMR signal by the power amplifier 4 and sent to an NMR probe 6 via a duplexer 5. Then, the signal is applied as RF pulses to the sample from a sample coil (not shown) placed within the probe 6.

After the RF irradiation, a feeble NMR signal emanating from the sample is detected by the sample coil (not shown) placed within the NMR probe 6 and sent via the duplexer 5 to a preamplifier 7, where the signal is amplified.

A receiver 8 converts the frequency of the RF NMR signal amplified by the preamplifier 7 to an audio frequency that can be converted into a digital signal. At the same time, the receiver controls the amplitude. The NMR signal converted into the audio frequency by the receiver 8 is converted into a digital signal by an analog-to-digital data converter 9 and sent to a control computer 10.

The control computer 10 controls the phase controller 2 and amplitude controller 3, Fourier-transforms the NMR signal accepted in the time domain, automatically corrects the phase of the Fourier-transformed NMR signal, and then displays the NMR signal as an NMR spectrum.

There are several kinds of RF radiation applied to the NMR probe 6. In particular, RF radiation corresponding to the resonant frequency of any one of nuclear species as shown in FIG. 2 is applied to the NMR probe. In the table of FIG. 2, the chemical symbols on the left side of each column of the table indicate the kinds of nuclei under observation, while the numerical values on the right side indicate the resonant frequencies (in MHz) of the observed nuclei in a case where they are placed within a static magnetic field of 18 tesla (T). Generally, nuclear species are classified into a group of nuclear species resonating at relatively high frequencies, such as $^3H$ nucleus to $^{19}F$ nucleus, and a group of nuclear species resonating at relatively low frequencies, such as $^{205}Tl$ nucleus to $^{103}Rh$ nucleus, and the two groups are treated separately. Radio frequencies of the former group are referred to as HF. Radio frequencies of the latter group are referred to as LF.

In many NMR measurements, plural nuclear species are excited at the same time and multiple resonance measurements are performed. For example, as can be seen from FIG. 2, nuclear species which are close in resonant frequency, such as $^1H$ and $^{19}F$ nuclei, are often selected as subjects to be investigated by NMR.

Generally, an NMR spectrometer is equipped with a lock mechanism for feeding variations in frequency of the NMR signal of deuterium nuclei contained in the sample back to the intensity of the static magnetic field in order to maintain constant the intensity of the static field applied to the sample to be investigated. An RF signal (hereinafter referred to as the lock signal) for this purpose is simultaneously applied to the sample coil.

FIGS. 3A and 3B show examples of an NMR probe having a singly tuned circuit that has the simplest structure and highest sensitivity (i.e., highest efficiency). In each of FIGS. 3A and 3B, a sample coil $L_S$ irradiates a sample inserted therein with an RF magnetic field and detects an NMR signal emanating from the sample after a lapse of a given time. The sample coil $L_S$ has capacitance $C_S$. A tuning capacitor $C_1$ is used for RF radiation HF1. A tuning variable capacitor VC1 is also used for the RF radiation HF1. A matching variable capacitor VC2 is used also for the RF radiation HF1. A tuning capacitor C3 is used for locking RF radiation (LOCK). A matching capacitor C4 is used also for the locking RF radiation.

FIG. 3A shows an NMR probe designed to cause different sample coils to resonate with the HF1 and the lock signal (LOCK). FIG. 3B shows an NMR probe designed to cause the same sample coil to resonate with the HF1 and the lock signal. In FIG. 3B, separation circuits 1 and 2 are mounted to separate the HF1 and the lock signal.

It is now assumed that a maximum sensitivity (efficiency) of the geometry of FIG. 3A is 100%. Because any member inducing interference with the resonance with the HF1 does not exist, the most ideal fundamental performance is secured.

The separation circuits are attached to the NMR probe of FIG. 3B. Generally, each separation circuit is an LC parallel resonant circuit for blocking the frequency corresponding to HF1. A dummy coil having some length may be disposed, and the frequency corresponding to HF1 may be blocked by resonating surrounding stray capacitance with a helical coil. The loss induced by the separation circuit affects the sensitivity. Because the effect is approximately 5% to 10%, it can be said that the sensitivity of the NMR probe of FIG. 3B is about 90%.

The circuits of FIGS. 3A and 3B can be tuned to the resonant frequency of $^1H$ nucleus and to the resonant frequency of $^{19}F$ nucleus. That is, the circuits can be tuned to any arbitrary frequency in the resonant frequency band HF of from $^1H$ nucleus to $^{19}F$ nucleus by appropriately adjusting the tuning variable capacitor VC1 and matching variable capacitor VC2.

The resonant frequency of such a circuit is tuned to the resonant frequency of $^1H$ nucleus. An input voltage of 1 $V_{p-p}$ (peak-to-peak voltage) is applied across the circuit. If the sensitivity of the circuit is expressed using an amplitude voltage resonating at the opposite ends of the sample coil, a sensitivity of 100% is given by about 8 $V_{p-p}$. There is a difference associated with √1 a between when the resonant frequency is the resonant frequency of $^1H$ nucleus and when the resonant frequency is the resonant frequency of $^{19}F$ nucleus but, generally speaking, the difference is so small that it can be neglected here. It is assumed that both kinds of nuclei produce substantially the same voltage.

It is desired to confirm that in the circuit of FIG. 3A, target voltages of the $^1H$ nucleus resonant frequency and the $^{19}F$ nucleus resonant frequency are about 8 $V_{p-p}$ because this is also related to the following description. The circuit of FIG. 3B has an expectation value of about 7 $V_{p-p}$. However, both circuits of FIGS. 3A and 3B have the disadvantage that the circuit can be tuned to only one nucleus (either the $^1H$ nucleus resonant frequency or the $^{19}F$ nucleus resonant frequency) at any time.

FIGS. 4A, 4B, and 4C show an example of a multiple-tuning NMR probe capable of tuning to two nuclei of $^1H$ and $^{19}F$ at the same time. As shown in FIG. 4C, two sample coils having different diameters are disposed concentrically. A $^1H$ tuning-and-matching circuit and a $^{19}F$ tuning-and-matching circuit which are independent of each other are built for the sample coils, respectively.

Which of the inner or outer coil should be used for $^1H$ nuclear spectroscopy or $^{19}F$ nuclear spectroscopy depends on the required application. Normally, the inner coil is used for nuclear NMR spectroscopy requiring higher sensitivity. Referring to FIGS. 4A and 4B, there are two cases. In one case, $L_s1=^1H$ and $L_s2=^{19}F$. In the other, $Ls1=^{19}F$ and $Ls2=^1H$.

A mixture of inductive coupling and capacitive coupling is present between the two sample coils and so the sensitivity loss due to the coupling is about 15%. Therefore, the sensitivity of the circuit formed by the inner sample coil to the nuclear species is in the neighborhood of 85%. For a detector for a sample tube, for example, of 5 mm, the diameter of the inner coil is about 6 mm, while the diameter of the outer coil is about 11 mm. The ratio 6:11 of the diameters is considered as an element associated with the sensitivity.

It is expected that the sensitivity will be increased with reducing the distance between the sample tube and the sample coil. Therefore, the detection sensitivity of the circuit formed by the outer sample coil is 85×6/11≅50%. That is, in the geometry of FIG. 4A, the sensitivity of the inner coil, which is closer to the sample tube, to the nuclear species is about 85%. The sensitivity of the outer coil, which is farther from the sample tube, to the nuclear species is about 50%.

The geometry of FIG. 4A is expressed using the same concept. In a first case, lock circuitry is attached to the inner coil. In a second case, lock circuitry is attached to the outer coil.

Based on the concept described so far, in the first case, the detection sensitivity is about 85%×0.9=77%. In the second case, the detection sensitivity is about 50×0.9=45%. Therefore, in the first case, the sensitivity of the inner coil would be about 77%, while the sensitivity of the outer coil would be about 50%. In the second case, the sensitivity of the inner coil would be about 85%. The sensitivity of the outer coil would be about 45%.

In any case, the resonant frequency of $^1H$ nucleus and the resonant frequency of $^{19}F$ nucleus are very close to each other. Tuning to the resonant frequencies results in cross interference. Therefore, if one attempts to tune to the other frequency, it is difficult to make a clear tuning setting because it is hindered by crosstalk.

Consequently, tuning ranges are limited to mutually distant positions. For example, in a 400 MHz NMR spectrometer, separate tuning ranges of f($^{19}F$)=376 MHz and f($^1H$)=400 MHz are defined with a space of tens of MHz therebetween. In a 500 MHz NMR instrument, separate tuning ranges of f($^{19}F$)=470 MHz and f($^1H$)=500 MHz are defined.

When checked with resonant voltages, in the geometry of FIG. 4A, a combination of heteronuclear species of ~8×0.85≅6.8 $V_{p-p}$ ($^1H$ or $^{19}F$) and ~8×0.5≅4 $V_{p-p}$ ($^{19}F$ or $^1H$) can be anticipated. Similarly, in the geometry of FIG. 4B, combination of heteronuclear species of ~8×0.77≅6.2 $V_{p-p}$ ($^1H$ or $^{19}F$) and ~8×0.5≅4 $V_{p-p}$ ($^{19}F$ or $^1H$) or a combination of heteronuclear species of ~8×0.85≅6.8 $V_{p-p}$ ($^1H$ or $^{19}F$) and ~8×0.45≅3.6 $V_{p-p}$ ($^{19}F$ or $^1H$) can be anticipated.

The example of FIGS. 5A and 5B is intended for compatibility of two frequencies in the same way as in the geometries of FIGS. 4A and 4B. The difference is that a circuit is built in one sample coil. In the geometry of FIGS. 5A and 5B, it is possible to tune to both $^1H$ nucleus resonant frequency and $^{19}F$ nucleus resonant frequency using a double tuning circuit equipped with generally known separation circuits. To prevent the sensitivity at the $^{19}F$ nuclear resonant frequency from being deteriorated, the inductance of an inductor included in an LC parallel resonant circuit used in a separation circuit 3 is set to a minimum value.

In FIG. 5A, lock circuitry is attached to the other sample coil. In FIG. 5B, lock circuitry is attached to one sample coil. In FIG. 5A, a variable capacitor VC2 is a matching capacitor common to the $^1H$ nucleus resonant frequency and the $^{19}F$ nucleus resonant frequency and set to a position where the capacitance value is pseudo-matched at both resonant frequencies. VC1 is a tuning variable capacitor for $^1H$ nucleus. VC3 is a tuning variable capacitor for $^{19}F$ nucleus. A fixed capacitor C1 is used for tuning to an HF frequency range including the $^1H$ nucleus resonant frequency and the $^{19}F$ nucleus resonant frequency.

In this circuit, it is impossible to make complete matching to each individual frequency. As a result, a slight amount of loss arises. Since the RF radiation for the $^1H$ nucleus is blocked by the separation circuit 3, the effects of the tuning variable capacitor VC3 are alleviated. However, a loss corresponding to the separation circuit results. In total, the sensitivity is given approximately by 100×0.9×0.9≅80%. Because the RF radiation for the $^{19}F$ nucleus is affected by the whole amount of loss in the separation circuit, the sensitivity is given approximately by 100×0.9×0.6≅54%.

In FIG. 5B, lock circuitry is attached and, therefore, the RF radiation for $^1H$ nucleus and the RF radiation for $^{19}F$ nucleus suffer from the loss due to the lock circuitry. As a result of these considerations, the sensitivity to the RF radiation for $^1H$ nucleus becomes lower than the sensitivity of the circuit of FIG. 5A and would be given approximately by 80×0.9≅72%. The sensitivity to the RF radiation for $^{19}F$ nucleus would be given approximately by 54×0.9×0.9≅43%.

When checked with resonant voltages, in the geometry of FIG. 5A, results V(1H)=~8×0.80≅6.4 $V_{p-p}$ and V($^{19}F$)=8× 0.54≅4.3 $V_{p-p}$ can be anticipated. Similarly, in the geometry of FIG. 5B, results given by V($^1H$)=8×0.72=5.7 $V_{p-p}$ and V($^{19}F$)=8×0.48≅3.8 $V_{p-p}$ or results given by V($^1H$)=8× 0.85≅6.8 $V_{p-p}$ and V($^{19}F$)=8×0.43≅3.4 $V_{p-p}$ can be anticipated.

The contents of the description provided so far are summarized in Table 1, where evaluated sensitivities are given in % and compared. The efficiencies of various methods evaluated using voltages are listed in Table 2, the methods having been used where maximum resonant voltage was about 8 $V_{p-p}$ when a reference input was 1 $V_{p-p}$. The efficiencies of various methods evaluated using voltages are listed in Table 3, the methods having been used where maximum resonant voltage was about 11.5 $V_{p-p}$ when a reference input was 1 $V_{p-p}$.

TABLE 1

| | efficiency (%) evaluated using resonant voltage | | | | | |
|---|---|---|---|---|---|---|
| | incompatibility of $^1H$ and $^{19}F$: SW mode | | compatibility of $^1H$ and $^{19}F$: SW mode | | compatibility of $^1H$ and $^{19}F$: SW mode | |
| nucleus under investigation | FIG. 3A | FIG. 3B | FIG. 4A | FIG. 4B | FIG. 5A | FIG. 5B |
| $^1H$ | 100 | 90 | 85  50 | 77  50 | 85  45 | 80 | 72 |
| $^{19}F$ | 100 | 90 | 50  85 | 50  77 | 45  85 | 54 | 43 |

TABLE 2

| | efficiency ($V_{p-p}$) evaluated using resonant voltage | | | | | | |
|---|---|---|---|---|---|---|---|
| nucleus under | incompatibility of $^1$H and $^{19}$F: SW mode | | compatibility of $^1$H and $^{19}$F: SW mode | | | compatibility of $^1$H and $^{19}$F: SW mode | |
| investigation | FIG. 3A | FIG. 3B | FIG. 4A | | FIG. 4B | FIG. 5A | FIG. 5B |
| $^1$H | 8 | 7.2 | 6.8  4 | 6.2  4 | 6.8  3.6 | 6.4 | 5.8 |
| $^{19}$F | 8 | 7.2 | 4  6.8 | 4 | 6.2  3.6  6.8 | 4.3 | 3.4 |

* It is assumed that resonant voltage is ~8 $V_{p-p}$ at maximum efficiency when 1 $V_{p-p}$ is applied.

TABLE 3

| | efficiency ($V_{p-p}$) evaluated using resonant voltage | | | | | | |
|---|---|---|---|---|---|---|---|
| nucleus under | incompatibility of $^1$H and $^{19}$F: SW mode | | compatibility of $^1$H and $^{19}$F: SW mode | | | compatibility of $^1$H and $^{19}$F: SW mode | |
| investigation | FIG. 3A | FIG. 3B | FIG. 4A | | FIG. 4B | FIG. 5A | FIG. 5B |
| $^1$H | 11.5 | 10.35 | 9.775  5.75 | 8.9  5.8 | 9.8  5.2 | 9.2 | 8.28 |
| $^{19}$F | 11.5 | 10.35 | 5.75  9.775 | 5.8  8.9 | 5.2  9.8 | 6.2 | 4.945 |

* It is assumed that resonant voltage is ~11.5 $V_{p-p}$ at maximum efficiency when 1 $V_{p-p}$ is applied.

The first means which can tune to RF radiation for $^{19}$F nucleus and RF radiation for $^1$H nucleus and which permits observation at the highest sensitivity is to use the probe of FIGS. 3A and 3B that shows maximum sensitivities respectively to the RF radiation for $^{19}$F nucleus and RF radiation for $^1$H nucleus. Sometimes, only the RF radiation for $^1$H nucleus is observed. In other times, only the RF radiation for $^{19}$F nucleus is observed.

In this method, however, a long time is required to observe a compound containing both $^{19}$F nucleus and $^1$H nucleus. Furthermore, in order to know how both nuclei are associated, it is impossible to control behaviors of the other nucleus coupled to the nucleus under observation. Consequently, it has been impossible to know the correlation between both nuclei. Hence, it may be reasonably said that the analytical apparatus does not have sufficient functions required for analysis.

Accordingly, probes capable of observing and irradiating $^{19}$F nucleus and $^1$H nucleus simultaneously have been offered. Each probe shown in FIGS. 4A-4C is capable of FH compatibility mode and has two ports employing two sample coils to which RF radiation for $^{19}$F nucleus and RF radiation for $^1$H nucleus are assigned, respectively. FIGS. 5A and 5B show a probe that is also capable of FH compatibility mode but has one port using a single sample coil to which RF radiation for $^{19}$F nucleus and RF radiation for $^1$H nucleus can be applied.

The geometry of FIGS. 4A-4C has the problem that when a user attempts to observe $^{19}$F nucleus and $^1$H nucleus both at maximum sensitivity, he must prepare two high-sensitivity probes for $^{19}$F nucleus and $^1$H nucleus, respectively. The geometry of FIGS. 5A and 5B has the problem that electric powers of two frequencies must be handled by one port, thus producing adverse effects, such as generation of heat by the high power of the irradiation side.

Furthermore, there is the problem that the sensitivity to $^{19}$F nucleus and the sensitivity to $^1$H nucleus are different greatly due to circuit configurations and because of the difference in distance between the sample tube and the coil. It has been known that both $^{19}$F nucleus and $^1$H nucleus are nuclear species providing high detection sensitivity per se. However, it is desired to have a probe which has high sensitivity and shows identical sensitivities to both nuclei or which is so designed that greater importance is placed on the sensitivity to $^{19}$F nucleus showing a considerably wide range of chemical shifts.

SUMMARY OF THE INVENTION

In view of the foregoing, it is an object of the present invention to provide an NMR probe which enables a compatibility mode while maintaining maximum sensitivities to both $^{19}$F nucleus and $^1$H nucleus.

An NMR probe that achieves the object in accordance with the teachings of the present invention has: a sample coil having two ends A and B; a hollow tubular body formed by a conductive wall at ground potential, the tubular body having one wall surface having an open portion; and two rod electrodes disposed inside the hollow tubular body substantially in a parallel relationship to each other axially of the tubular body. Respective one ends of the two rod electrodes are connected with the ends A and B, respectively, of the sample coil through the open portion. The other ends of the rod electrodes are electrically grounded to the hollow tubular body at a wall surface located opposite to the wall surface having the open portion. An RF input-output port corresponding to the resonant frequency of $^1$H nucleus is connected with the end A of the sample coil via a tuning and matching device. Another RF input-output port corresponding to the resonant frequency of $^{19}$F nucleus is connected with the end B of the sample coil via another tuning and matching device.

The rod electrodes are approximately (2n−1) times (where n is a natural number) as long as a quarter wavelength of RF radiation in resonance.

The present invention also provides an NMR probe having: a sample coil having two ends A and B; a hollow tubular body formed by a conductive wall at ground potential, the tubular body having two opposite wall surfaces each having an open portion; and two rod electrodes disposed inside the hollow tubular body substantially in a parallel relationship to each other axially of the tubular body. Respective one ends of the two rod electrodes are connected with the ends A and B, respectively, of the sample coil via one of the open portions. The other ends of the electrodes are made open at the other open portion. An RF input-output port corresponding to the resonant frequency of $^1$H nucleus is connected with the end A of the sample coil via a tuning and matching device. Another RF input-output port corresponding to the resonant frequency of $^{19}$F nucleus is connected with the end B of the sample coil via another tuning and matching device.

The rod electrodes are approximately 2n times (where n is a natural number) as long as a quarter wavelength of RF radiation in resonance.

The rod electrode connected with the end A is thicker than the rod electrode connected with the end B.

The two rod electrodes connected with the two ends A and B of the sample coil can freely establish and break the connection between the ends A and B.

The sample coil has a capacitive component. The ratio of the detection sensitivity of the RF side to the resonant frequency of $^1$H nucleus to the detection sensitivity of the RF side to the resonant frequency of $^{19}$F nucleus can be varied by controlling the magnitude of the capacitive component.

Additional sample coils are arranged concentrically around the first-mentioned sample coil. The additional sample coils can resonate with an LF frequency or with a lock frequency.

The hollow tubular body can have a polygonal cross section having an inside dimension substantially equal to or less than the inside diameter of an assembly consisting of a superconducting NMR magnet and room temperature shims mounted in bores formed in the magnet.

The hollow tubular body can have a circular cross section having an inside dimension substantially equal to or less than the inside diameter of an assembly consisting of a superconducting NMR magnet and room temperature shims mounted in bores formed in the magnet.

The hollow tubular body can have an elliptical cross section having an inside dimension substantially equal to or less than the inside diameter of an assembly consisting of a superconducting NMR magnet and room temperature shims mounted in bores formed in the magnet.

One NMR probe, according to the present invention, has: a sample coil having two ends A and B; a hollow tubular body formed by a conductive wall at ground potential; and two rod electrodes disposed inside the tubular body in a parallel relationship to each other axially of the tubular body. The conductive wall has one wall surface having an open portion. Respective one ends of the rod electrodes are connected with the two ends A and B, respectively, of the sample coil through the open portion. The other ends of the electrodes are electrically grounded to the hollow tubular body at a wall surface located opposite to the wall surface having the open portion. An RF input-output port corresponding to the resonant frequency of $^1$H nucleus is connected with the end A of the sample coil via a tuning and matching device. Another RF input-output port corresponding to the resonant frequency of $^{19}$F nucleus is connected with the end B of the sample coil via another tuning and matching device. Consequently, the NMR probe can be offered which is capable of supporting a compatibility mode while maintaining maximum sensitivities to both $^{19}$F nucleus and $^1$H nucleus at all times.

The present invention also provides an NMR probe having: a sample coil having two ends A and B; a hollow tubular body formed by a conductive wall at ground potential, the tubular body having two opposite wall surfaces each having an open portion; and two rod electrodes disposed inside the hollow tubular body substantially in a parallel relationship to each other axially of the tubular body. Respective one ends of the two rod electrodes are connected with the ends A and B, respectively, of the sample coil via one of the open portions. The other ends of the electrodes are made open at the other open portion. An RF input-output port corresponding to the resonant frequency of $^1$H nucleus is connected with the end A of the sample coil via a tuning and matching device. Another RF input-output port corresponding to the resonant frequency of $^{19}$F nucleus is connected with the end B of the sample coil via another tuning and matching device. Consequently, the NMR probe can be offered which is capable of supporting a compatibility mode while maintaining maximum sensitivities to both $^{19}$F nucleus and $^1$H nucleus at all times.

Other features and advantages of the present invention will become apparent from the following more detailed description, taken in conjunction with the accompanying drawings, which illustrate, by way of example, the principles of the invention.

DESCRIPTION OF THE PREFERRED EMBODIMENTS

The preferred embodiments of the present invention are hereinafter described with reference with the accompanying drawings.

Embodiment 1

Figure 6:
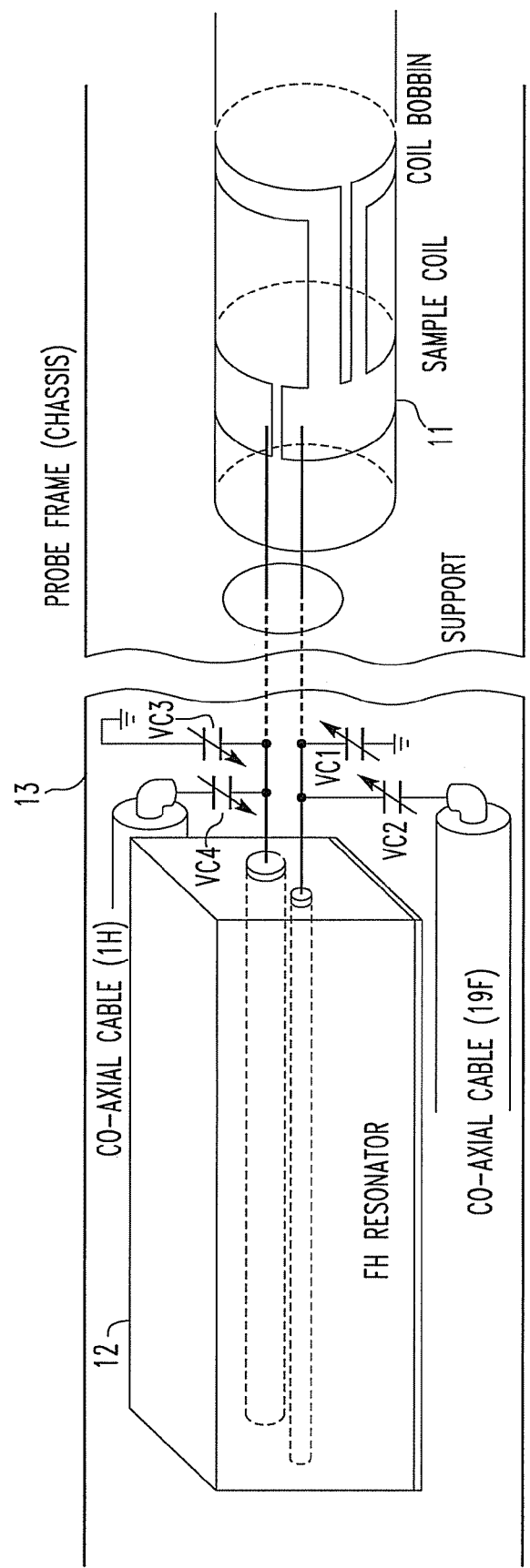
FIG. 6 is a perspective view of one NMR probe, according to the present invention.

One example of an NMR probe associated with the present invention is shown in FIGS. 6-9. FIG. 6 shows a mode of practice reduced to bare minimum, i.e., the simplest mode of practice, in practicing the present invention. The mode of practice has a sample coil 11 across which a coupled-type FH coaxial resonator 12, according to the present invention, is connected. A probe frame 13 is at ground potential.

It is assumed that there are two frequencies f1 (e.g., the resonant frequency of $^1H$) and f2 (e.g., the resonant frequency of $^{19}F$) that are close to each other. The frequencies are assigned to two nodes, respectively, to which both ends of the sample coil 11 and the coupled-type FH coaxial resonator are coupled. The nodes assume high impedance at the frequencies. Therefore, input-output RF circuits are formed around the nodes. For example, let f1 be the resonant frequency of $^1H$ nucleus. Let f2 be the resonant frequency of $^{19}F$ nucleus. RF circuits for the frequencies are formed around the nodes.

Figure 7:
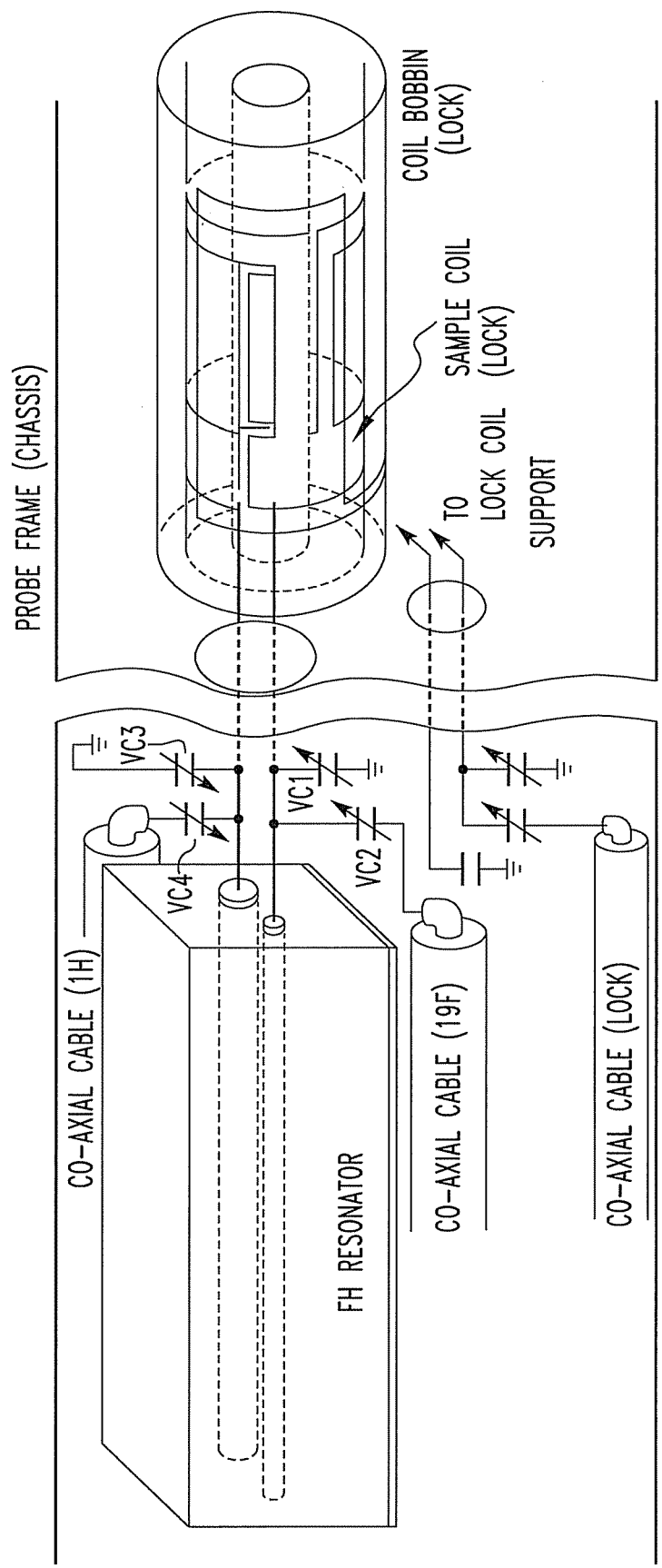
FIG. 7 is a perspective view of another NMR probe, according to the present invention.

FIG. 7 shows a circuit system matched to LF frequencies by adding a sample coil for LF to the above-described simple circuit system. In FIG. 7, some parts are omitted to facilitate understanding the illustration. An RF lock circuit is formed in a lock sample coil.

Figure 5A:
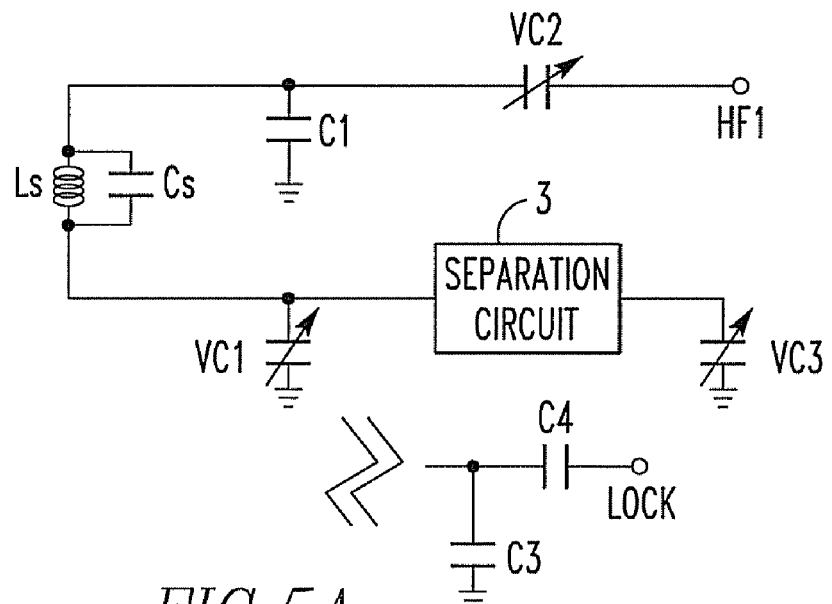
FIGS. 5A and 5B show circuit diagrams of a further conventional type of NMR resonant circuits.
Figure 5B:
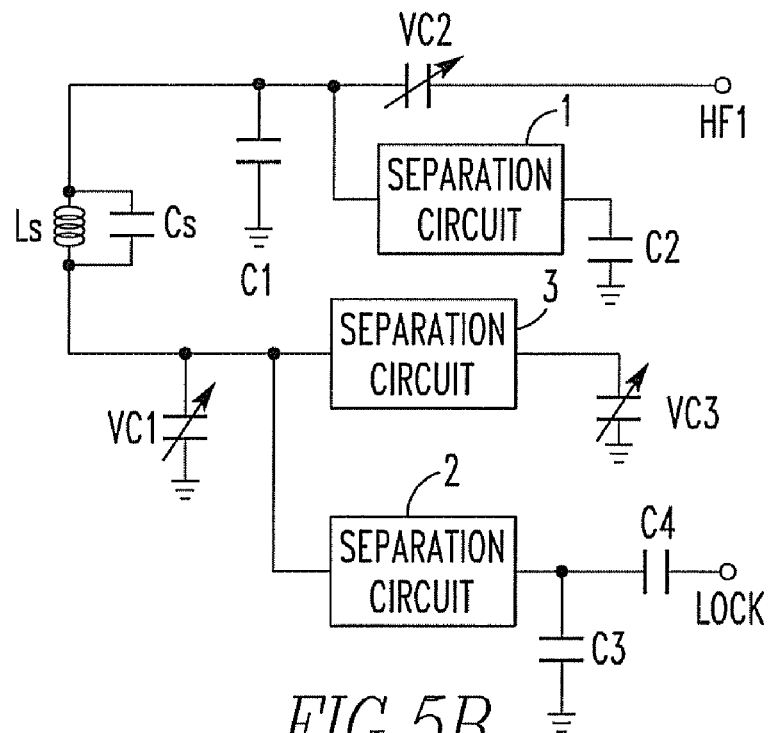

An NMR lock is usually used if the NMR probe is adapted for solution samples and, therefore, the circuit is designed as described previously. However, an NMR probe for solid samples essentially requires no lock. Therefore, where the purpose is only to make FH observations, the simplest circuitry as shown in FIGS. 5A and 5B is employed.

Figure 8:
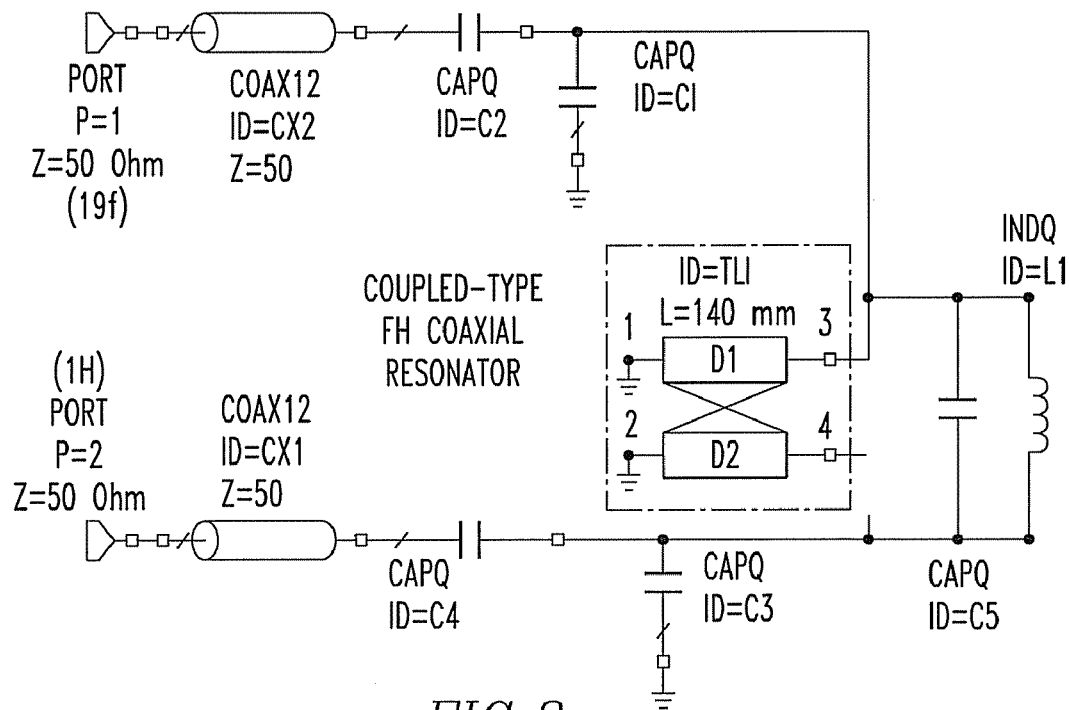
FIG. 8 illustrates a further NMR probe, according to the present invention.
Figure 9:
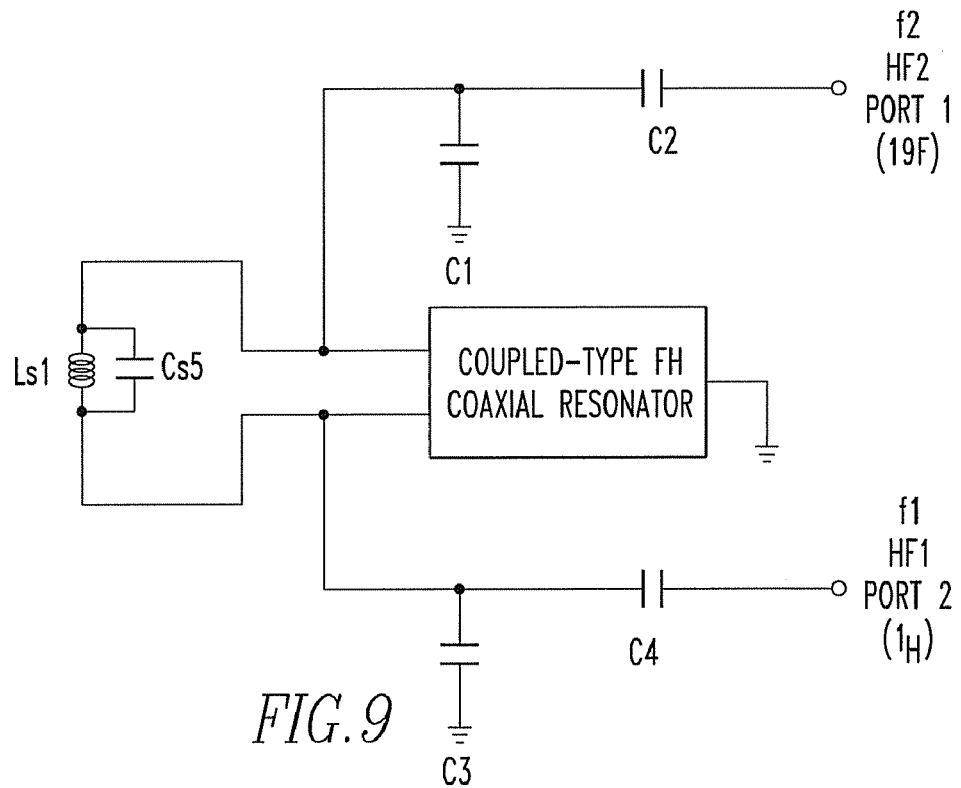
FIG. 9 is a circuit diagram of the NMR probe shown in FIG. 8.

FIG. 8 shows an empirically obtained circuit and gives a model used when an RF circuit analysis is made. FIG. 9 is a schematic diagram of the circuit. L1($L_s$1) indicates a sample coil. The sample coil has a resonance capacitance C5($C_s$5) including stray capacitance possessed by the sample coil. In this example, HF2 is assigned to the resonant frequency of $^{19}F$ nucleus. HF1 is assigned to the resonant frequency of $^1H$ nucleus. Also shown are a tuning variable capacitor C1 on the resonant frequency side of $^{19}F$ nucleus, a matching variable capacitor C2 on the resonant frequency side of $^{19}F$ nucleus, a tuning variable capacitor C3 on the resonant frequency side of $^1H$ nucleus, and a matching variable capacitor C4 on the resonant frequency side of $^1H$ nucleus.

Figure 10:
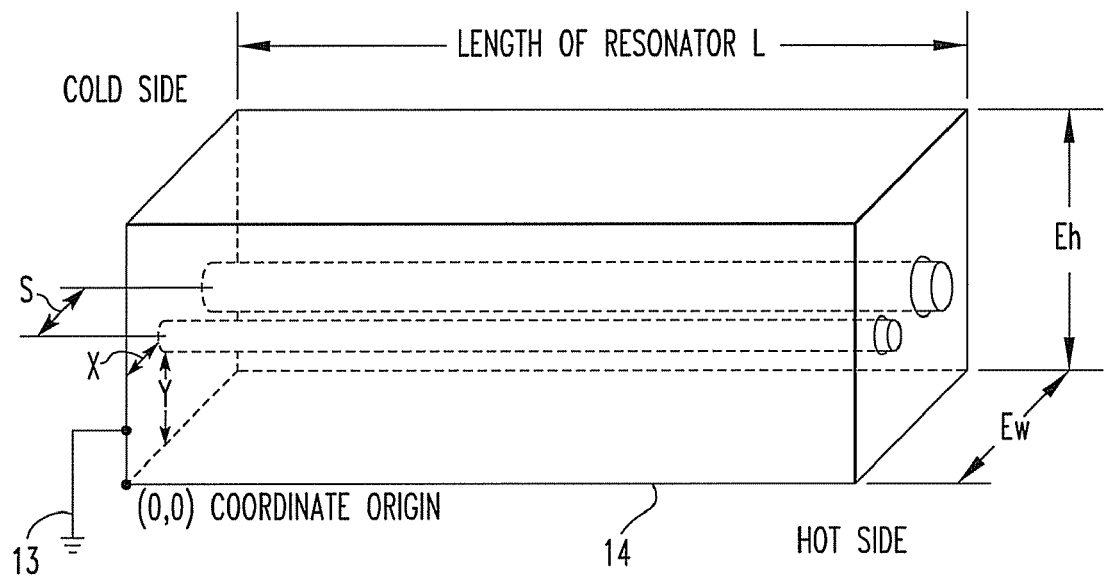
FIG. 10 schematically illustrates a coupled-type FH coaxial resonator, according to the present invention.
Figure 10:
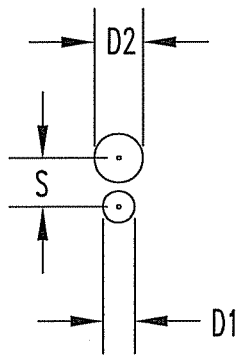
Figure 10:
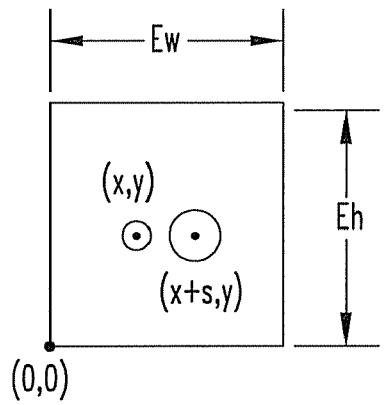
Figure 11:
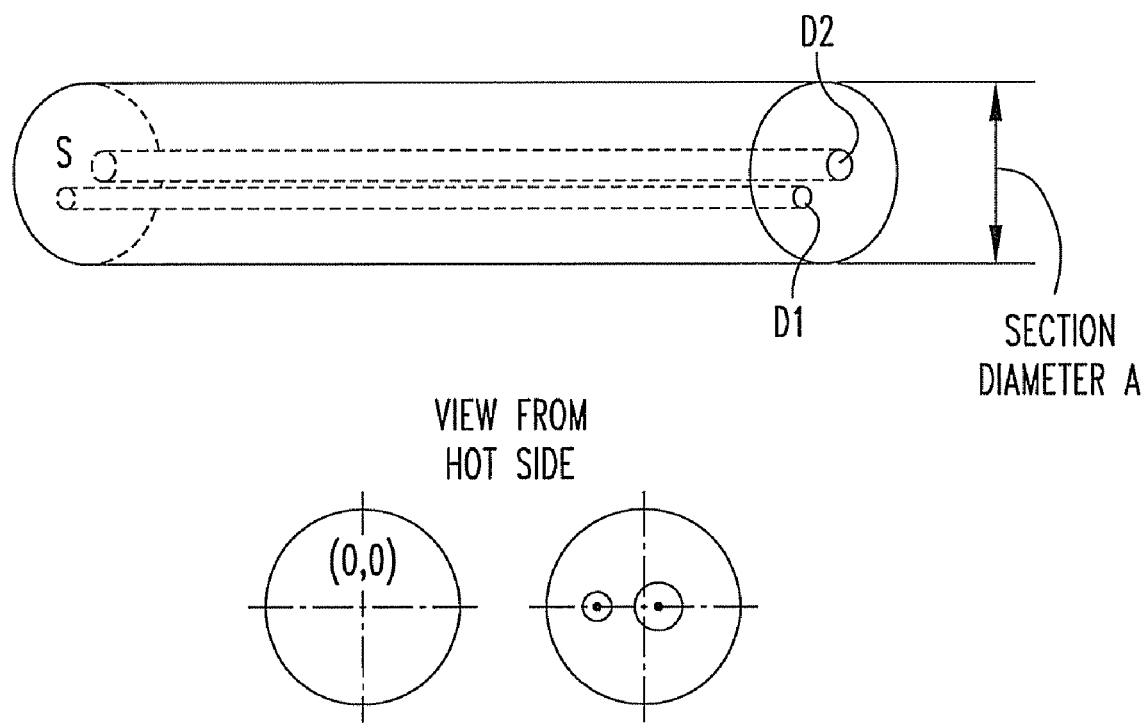
FIG. 11 shows a modification of the coaxial resonator shown in FIG. 10.

FIGS. 10 and 11 show the most important devices of the present embodiment. FIG. 10 schematically shows a coupled-type FH coaxial resonator having a rectangular cross section adapted for illustration of the present embodiment. FIG. 11 illustrates an example of application designed taking account of a shape matched to an inventive probe for use in a superconducting magnet NMR instrument.

The fundamental techniques of the present embodiment are described by describing the operation of the instrument by referring to FIG. 10. First, a resonant box 14 is fabricated from a hollow pillar-like body made of a metal and having a rectangular cross section. The box is adapted for hundreds of MHz to 1 GHz band. For example, the rectangular cross section is given by Ew×Eh. It is assumed that Ew=Eh≅28 mm. If the used frequency band is in the neighborhood of 500 MHz, the length resonating at a quarter wavelength is set approximately equal to the vertical length L of the resonant box. In this case, L≅140 mm (a quarter wavelength of 500 MHz is 150 mm).

The resonant box 14 is a hexahedron having six surfaces including a surface on the hot side (i.e., located at an antinode of RF radiation). Excluding this surface, all of the remaining five surfaces are covered with a metal. The six surfaces also include a surface on the cold side (i.e., located at a node of RF radiation), and this surface is connected with the probe frame 13 and grounded. As a result, all of the five surfaces excluding the surface on the hot side are at ground potential. At least two round metal rods that are different in thickness are mounted inside the hollow interior of the resonant box 14 and extend in a parallel relationship to each other axially of the box.

Let one corner of the end surface on the cold side be located at the origin (0,0). Coordinate positions of the rods are given by (x, y) and (x+S, y). It is assumed that x≅6 mm, y≅14 mm, and S≅14 mm. The thickness of the thinner round rod is given by D1. The thickness of the thicker round rod is given by D2. D1≅3 mm (diameter). D2≅11 mm (diameter).

Where such coordinate positions and dimensions are given, D1 and D2 resonate with each other at quite close frequencies. The rods resonate at the different frequencies though being coupled to each other. In this example, the thicker electrode D2 resonates at a higher resonant frequency. The thinner electrode D1 resonates at a lower resonant frequency. Two desired close frequencies can be obtained as resonant frequencies by adjusting the lengths approximately within a range of lengths (L) of from 140 to 150 mm. The lengths are fine-adjusted taking account of the variable range of frequencies and the range covered by the tuning capacitor. An experiment using an analysis model has shown that good operation was obtained at 140 mm.

In the example of FIG. 11, room temperature shims are mounted in the bores of the superconducting magnet of the NMR spectrometer. Under this condition, the hollow resonant box has a circular cross section of a diameter substantially equal to or less than the inside diameter of an assembly of the magnet and shims. In this example, resonant characteristics similar to the resonant characteristics of the hollow resonant box of rectangular cross section are obtained. The resonant box may have an elliptical cross section instead of the circular cross section.

Figure 12:
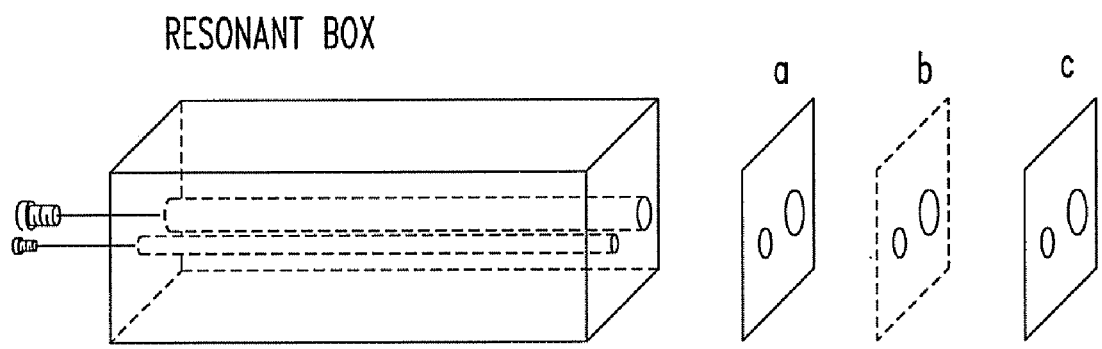
FIG. 12 shows a coupled-type FH coaxial resonator, according to the present invention, illustrating a method of fabricating the resonator.

A simple method of fabricating the resonant box is described by referring to FIG. 12. First, the round rod electrodes are screwed to a shielding plate on the cold side. Then, the electrodes are held by soldering. The thinner round electrode may be soldered after being held with tacks. As a result, the ends of the round rod electrodes on the cold side are grounded.

Round holes are formed in a metal cover a. The holes are large enough that the two round rod electrodes can pass through the holes without touching the wall surfaces. The cover a is placed over the surface on the hot side and mounted to it by crimping, press fitting, or other means while taking care to prevent the electrodes from touching the wall of the resonant box at ground potential. The metal cover is placed at ground potential. The two round rod electrodes are covered with the metal wall at ground potential, thus completing the outer box of the resonant box.

As the other example of the cover a, the resin or ceramic bushers b bushing two round holes of the cover a or the resin or ceramic cover c can be used instead of a cover a.

In the present embodiment, the metal cover having the round holes are used to provide a cover. Obviously, the metal cover having the round holes may be omitted, and the electrodes may be kept exposed.

A given resonant frequency midway between the resonant frequency of the thicker electrode D2 (f1≅resonant frequency of $^1$H nucleus) and the resonant frequency of the thinner electrode D1 (f2≅resonant frequency of $^{19}$F nucleus) is set by adjusting the resonant frequency $f_0$ determined by the inductance and resonant capacitance of the sample coil. Consequently, a resonant mode at the frequencies f1 and f2 are separated completely without interaction.

In order to impart optimum resonant conditions to the coaxial resonator, it is necessary to build the coupled-type FH coaxial resonator by determining the size of the outer box adapted for the probe and then determining parameters essential to the present embodiment such that the resonant conditions at the size are optimized.

For example, in the case of an NMR spectrometer using vertically placed superconducting magnets, narrow and wide bores in the magnets have diameters of 54 mm and 89 mm, respectively, as listed in Table 4. Because room temperature shims are mounted inside the bores to correct for inhomogeneities in the static magnetic field, the inside diameters of the bores are reduced accordingly. The effective outside diameters of probe frames capable of being inserted in the bores are 40 mm and 70 mm, respectively.

TABLE 4

| type of bore (ordinary name) | diameter of bore | effective outside diameter of probe frame |
|---|---|---|
| narrow bore | 54 mm | 40 mm |
| wide bore | 89 mm | 70 mm |

Figure 13:
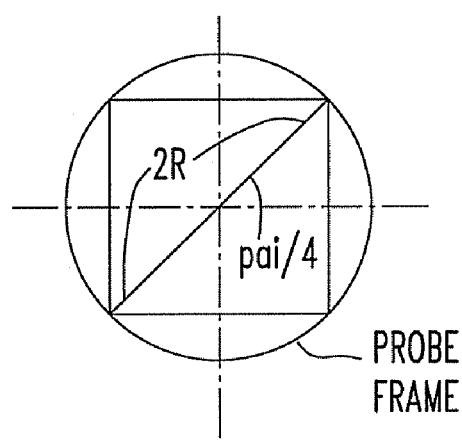
FIG. 13 is a diagram illustrating a square inscribed in the outer periphery of a frame.

The lengths of respective one sides of squares inscribed in the outer peripheries of the frames are 28 mm and 49 mm, respectively, as can be seen from FIG. 13 and Table 5. Accordingly, in the case of a narrow bore superconducting magnet, the outer box of the coupled-type FH coaxial resonator is square in cross section, and one side of the square should be less than 28 mm. In the case of a wide bore superconducting magnet, the outer box of the coupled-type FH coaxial resonator is square in cross section, and one side of the square should be less than 49 mm.

TABLE 5

| outside diameter of frame | square inscribed |
|---|---|
| 40 mm | 28 mm |
| 70 mm | 49 mm |

Assume that the outer box of the coupled-type FH coaxial resonator mounted in a narrow-bore probe has a rectangular cross section 28 mm square. A coupling-type FH coaxial resonator having fundamental numerals given by optimum conditions of essential parameters as described above should be fabricated.

Figure 14:
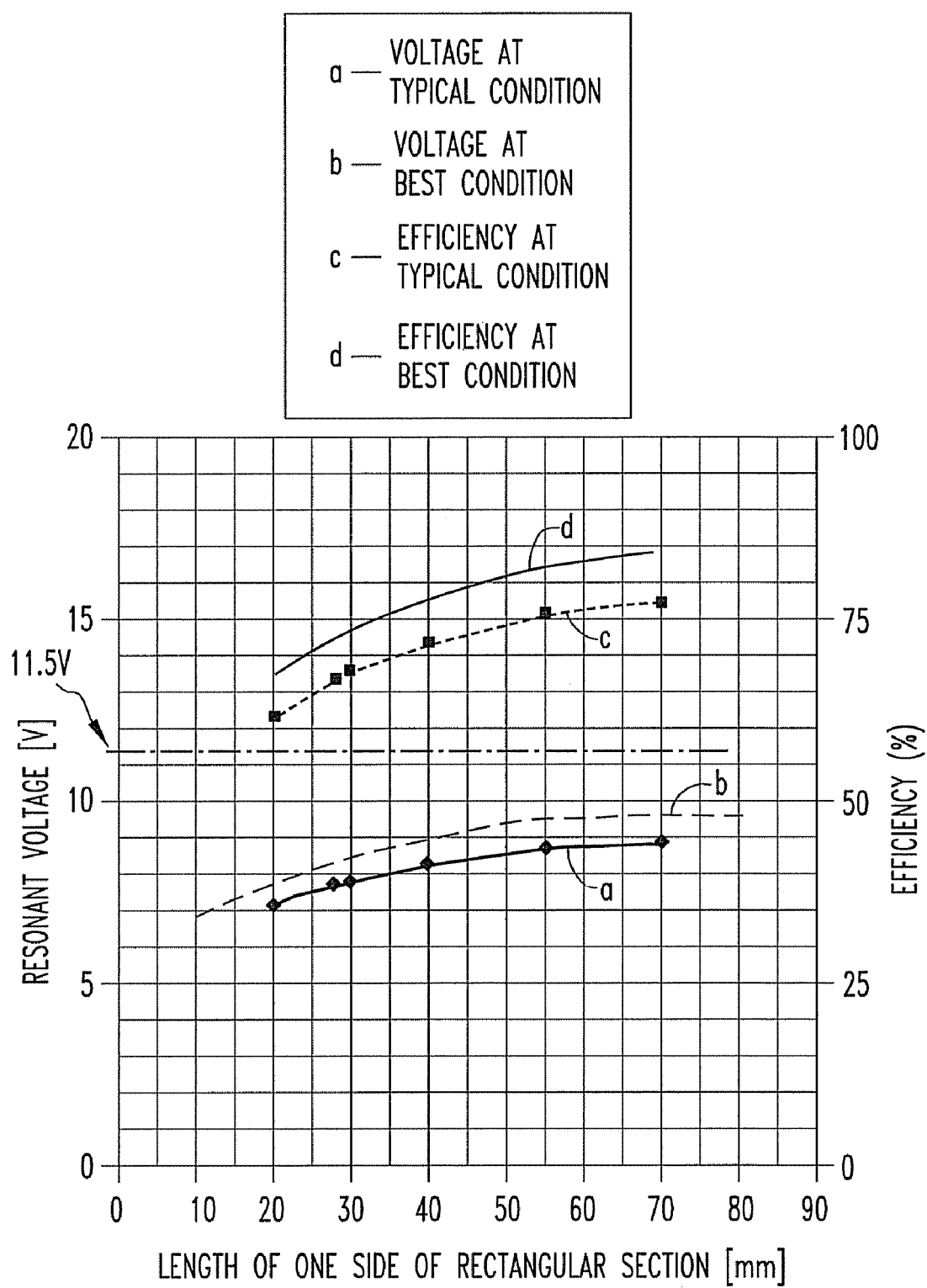
FIG. 14 is a graph showing the results of analysis of resonant voltages at the resonant frequencies of $^1$H nucleus and $^{19}$F nucleus.

FIG. 14 shows the results of analysis of resonant voltages to indicate the correlation between the rectangular cross sections of coupled resonators and resonant voltages applied to sample coils, as well as evaluated efficiencies. In the analysis, the resonant frequencies of $^1$H nucleus and $^{19}$F nucleus of a 500 MHz NMR instrument are assumed in the dimensions of various outer boxes in implementing the present embodiment. The vertical axis on the left side of the chart indicates the resonant voltage (in V) of RF radiation across the sample coil. The vertical axis on the right side indicates a rating index (in %) of resonance efficiency. The horizontal axis of the chart indicates the length (in mm) of one side of the rectangular outer box in the coupled-type FH coaxial resonator. The dot-and-dash line indicates maximum values (about 11.5 V) of the resonant voltage at each resonant frequency obtained from a combination of a sample coil and a needed resonant capacitance, namely a single tuning. The rating index (in %) of the resonance efficiency indicates anticipated values of resonance efficiency when double-tuning to $^{19}$F nucleus and $^1$H nucleus is done using outer boxes of various dimensions under the condition where the maximum resonant voltage of about 11.5 V is set to 100% when a single resonance is made with a standard frequency.

Table 6 indicates anticipated values of pulse width actually observed within a resonator when the same RF power is applied to the resonator under resonant conditions where the maximum resonant voltage of about 11.5 V is applied on the assumption that a 90°-pulse having a pulse width of about 5 μsec is observed in the resonator. It can be seen that as the pulse width approaches 5 μsec, the rating index of the resonance efficiency goes higher and that as the pulse width increases beyond 5 μsec, the resonance efficiency of the resonator drops. In this example, a simulation was made while varying the dimensions of the outer box from about 20 mm square to 70 mm square. The length of each one side of the outer box was varied. The other dimensions, i.e., the dimensions x, y, D1, D2, and S shown in FIG. 10 were set as the best each.

TABLE 6

| cross section index [mm] | typical conditions PW1 (FH compatibility) [μsec] | optimum conditions PW1 (FH compatibility) [μsec)] |
|---|---|---|
| 70 × 70 | 6.4 | 5.9 |
| 55 × 55 | 6.6 | 6.1 |
| 40 × 40 | 6.9 | 6.3 |
| 30 × 30 | 7.3 | 6.8 |
| 28 × 28 | 7.5 | 6.8 |
| 20 × 20 | 8.0 | 7.4 |

Conditions that are relatively easy to achieve are herein referred to as the typical conditions. Conditions that cannot be achieved unless extreme caution is exercised are herein referred to as optimum conditions. Final performance was evaluated under the typical and optimum conditions. Of the models having the sizes shown in FIG. 14 and Table 6, the 28-mm square model produced the FH compatibility performance in which the sensitivity was about 68% to 75% in terms of evaluated resonance voltage. It can be anticipated that the 49-mm square model will produce FH compatibility performance of about 75% to 81%.

Expressed by the aforementioned evaluation method using resonant voltages, the resonant voltage developed across the sample coil is about 8 $V_{p-p}$ for the 28-mm square model. The resonant voltage is about 9 $V_{p-p}$ for a 49-mm square model. A maximum 100% voltage is approximately 11.5 $V_{p-p}$.

In the present embodiment, the various parameters are so determined that the resonant voltage for $^1$H nucleus is brought into approximate coincidence with the resonant voltage for $^{19}$F nucleus and that their voltages are maximized by controlling the resonant frequency $f_0$ providing a basis and the thicknesses of D1 and D2. It is also possible to intentionally change the balance between the resonant voltage for $^1$H nucleus and the resonant voltage for $^{19}$F nucleus to attain the relationship V($^{19}$F)'>V($^1$H)', for example, by placing emphasis on the $^{19}$F nucleus side. As a rough estimate, considerations should be given to achieve V($^{19}$F)'+V($^1$H)'=2 V($^{19}$F). In particular, in the case where 2 V($^{19}$F)=2×8 V$_{p-p}$, the relationships V($^{19}$F)'=9 V$_{p-p}$ and V($^1$H)'=7 V$_{p-p}$ can be established.

Figure 15:
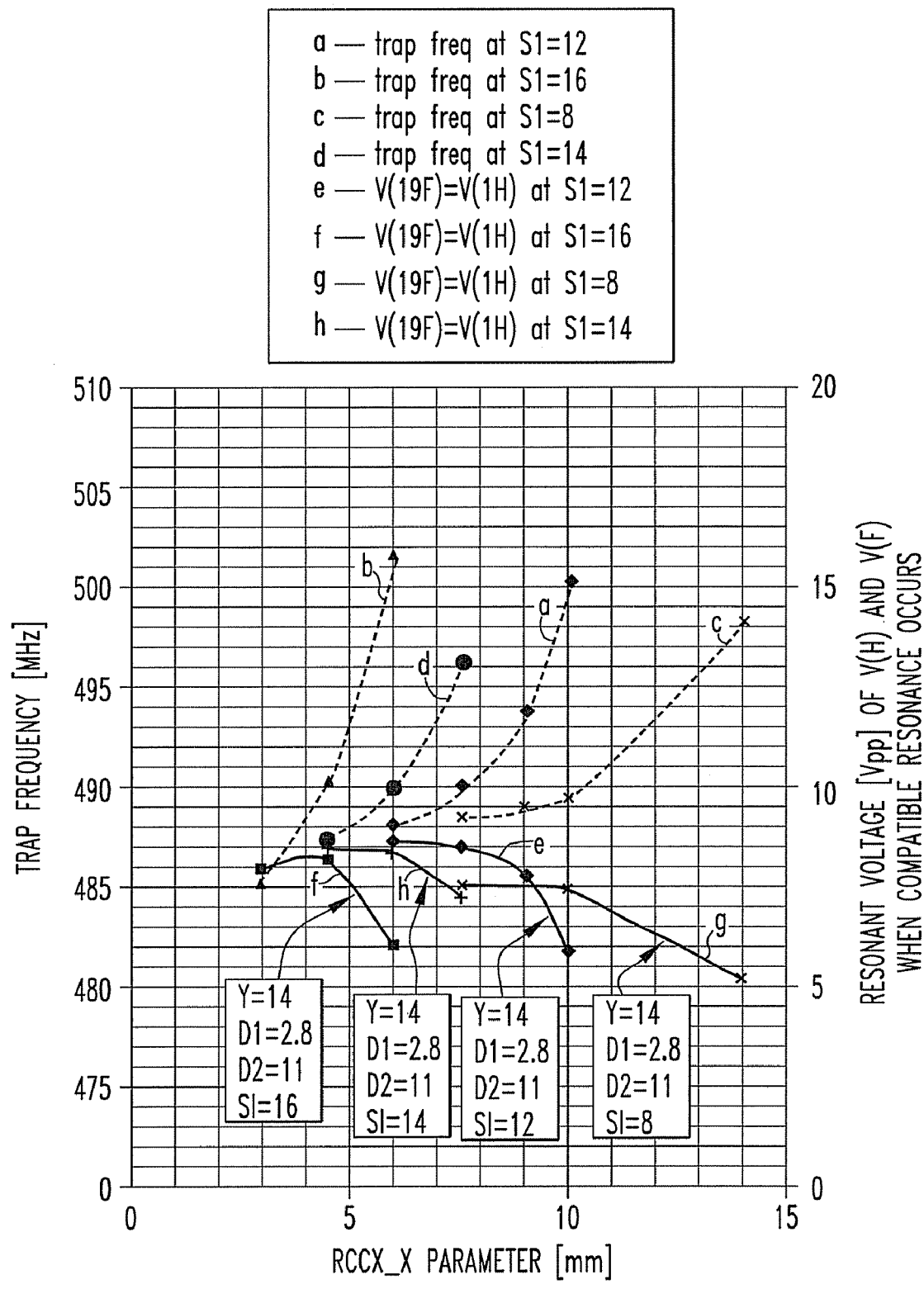
FIG. 15 is a graph showing the effects of shape and dimensions on a coupled-type FH coaxial resonator.
Figure 16:
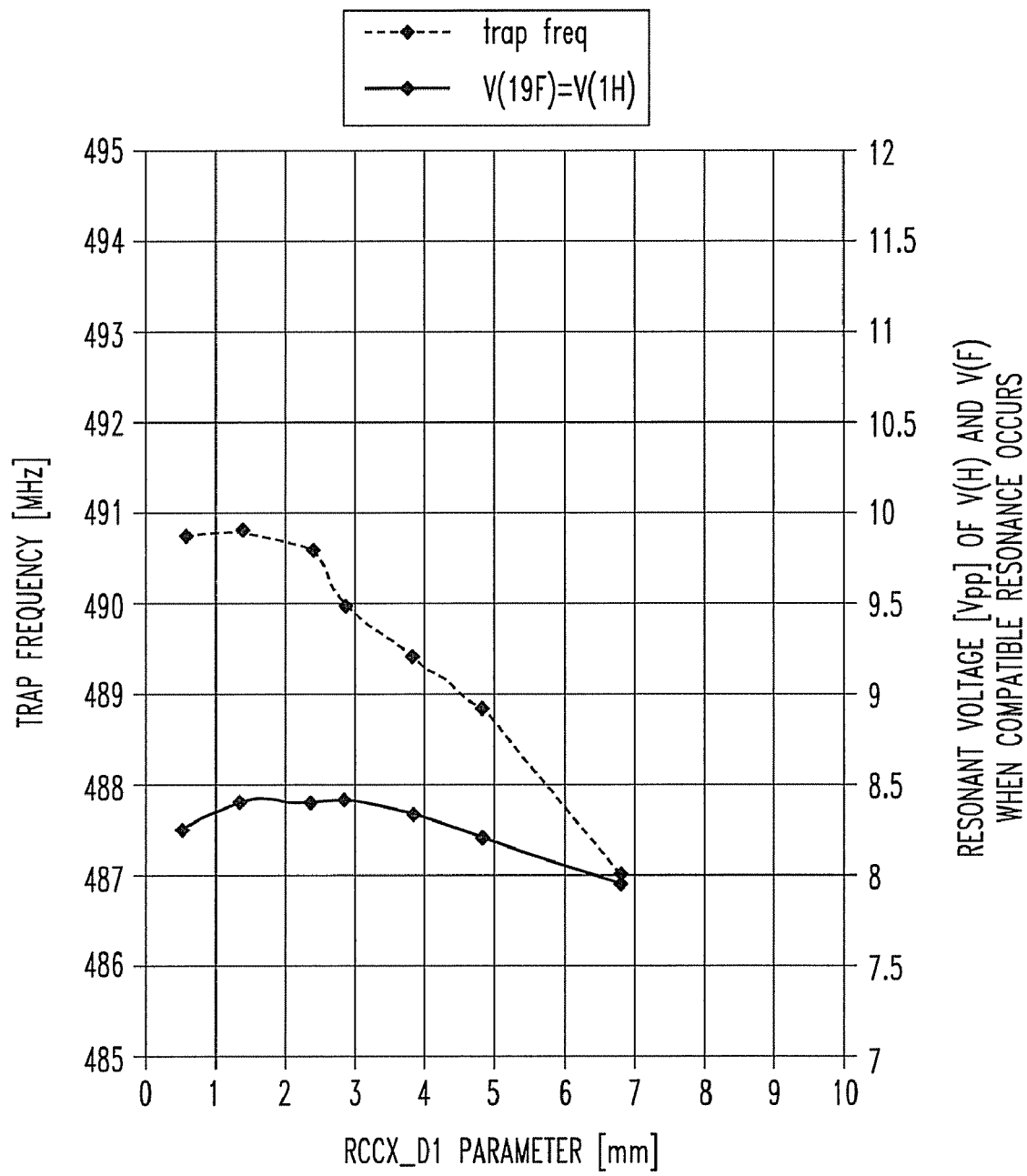
FIG. 16 is a graph showing the effects of the thickness of a round rod electrode D1 on a coupled-type FH coaxial resonator.
Figure 17:
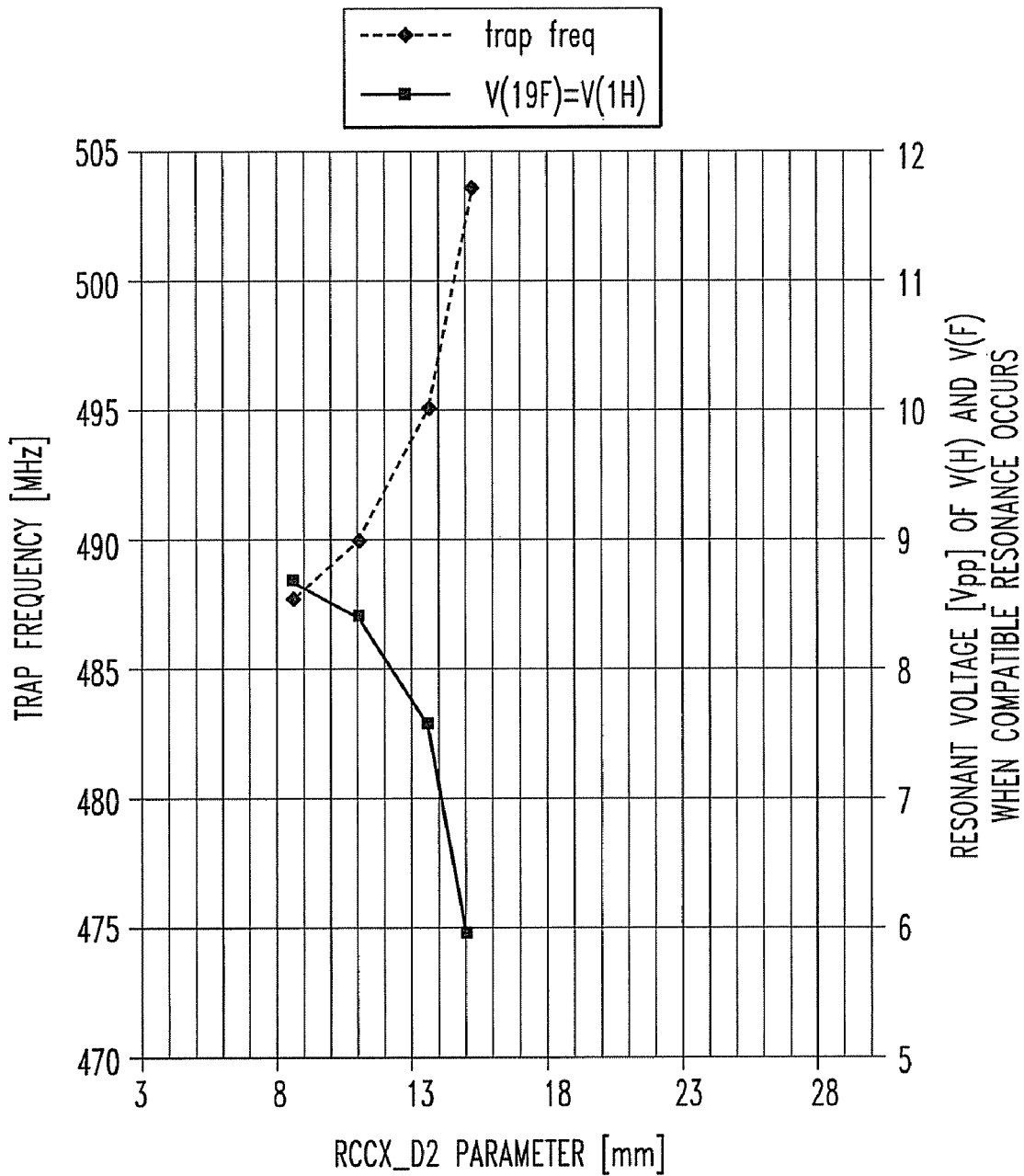
FIG. 17 is a graph showing the effects of the thickness of a round rod electrode D2 on a coupled-type FH coaxial resonator.

The parameters regarding the 28-mm square model have characteristics as shown in FIGS. 15-17. Desired conditions are selected from the parameters and their values are determined.

The distance y, the thickness D1 of the thinner rod electrode D1, and the thickness D2 of the thicker rod electrode D2 shown in FIG. 10 were kept at 14 mm, 2.8 mm, and 11 mm, respectively. Under these conditions, the space S (S1) between the two rod electrodes was set to four values of 16 mm, 14 mm, 12 mm, and 8 mm. The distance x was varied. The correlations among the frequency of the isolation valley (hereinafter referred to as the trap frequency (in MHz)) located between the resonant frequency of the rod electrode D1 and the resonant frequency of the rod electrode D2, the amplitude voltage V$_{pp}$ (in V), and the distance x are shown in the characteristic graph of FIG. 15.

The vertical axis on the left side of the graph indicates the trap frequency (in MHz). The vertical axis on the right side indicates the RF resonant voltage V$_{pp}$ (in V) developed across the sample coil. The horizontal axis indicates the distance x (in mm) between the outer box and the center of the rod electrode D1.

With respect to the positions where the electrodes D1 and D2 are placed, the graph suggests that it is better to place the electrode D1 at a distance of about a quarter of the length of one side of the rectangular cross section and to set the space S (S1) between D1 and D2 to about a half of the length of one side of the rectangular cross section.

The distances x, y, the thickness D2 of the thicker rod electrode D2, the space S between the two electrodes, and the length of one side of the outer box shown in FIG. 10 were kept at 6 mm, 14 mm, 11 mm, 14 mm, and 28 mm, respectively. Under these conditions, only the thickness D1 of the thinner electrode was varied. The correlation between the trap frequency (in MHz) and amplitude voltage V$_{pp}$ (in V) is shown in the characteristic graph of FIG. 16.

The vertical axis on the left side of the graph indicates the trap frequency (in MHz). The vertical axis on the right side indicates the RF resonant voltage V$_{pp}$ (in V) developed across the sample coil. The horizontal axis indicates the thickness (in mm) of the rod electrode D1. It can be seen that an appropriate thickness of the electrode D1 is about 10% of the length of one side of the rectangular cross section.

The distances x, y, the thickness D1 of the thinner rod electrode D1, the space S between the two electrodes, and the length of one side of the outer box shown in FIG. 10 were kept at 6 mm, 14 mm, 2.8 mm, 14 mm, and 28 mm, respectively. Under these conditions, only the thickness D2 of the thicker electrode was varied. The correlation between the trap frequency (in MHz) and the amplitude voltage V$_{pp}$ (in V) is shown in the characteristic graph of FIG. 17.

The vertical axis on the left side of the graph indicates the trap frequency (in MHz). The vertical axis on the right side indicates the RF resonant voltage V$_{pp}$ (in V) developed across the sample coil. The horizontal axis indicates the thickness (in mm) of the rod electrode D2.

Generally speaking, performance is improved if the thickness of the electrode D2 is made closer to the thickness of the electrode D1. However, if the electrodes are exactly identical in thickness, separation between the two frequencies is not sufficient for the characteristics of the resonator. That is, in the resonant modes at close frequencies, the relationship f1≠f2 does not hold but the equation f1=f2 holds. As a result, the intended purpose is not served.

If the two electrodes are close in thickness, a resonance at a frequency close to the fundamentally set frequency of 500 MHz predominates. As a result, the externally inserted tuning variable capacitor becomes almost useless. Therefore, it can be said that in practical applications, the resonator can be easily operated in cases where the thickness of the electrode D2 is approximately four times the thickness of the electrode D1.

With respect to the operation in terms of frequency, the resonant frequencies f1 and f2 are shifted toward the higher frequency side if the values of the parameters x (or y; represented by x because the cross section is a square), D2, and S are increased. The resonant frequencies f1 and f2 are shifted toward the lower frequency side if the values of the parameters x, D2, and S are reduced. When the value of D1 is increased, $^{19}$F(f2) is shifted toward the higher frequency side (toward $^1$H side). That is, when the value of D1 is increased, f2 gradually approaches the resonant frequency of $^1$H that is the fundamental frequency.

This phenomenon is described briefly. The thinner rod electrode parallel-resonates at a lower frequency through a combination of a large inductance L and the resulting resonant capacitance C. Conversely, the thicker rod electrode parallel-resonates at a higher frequency through a combination of a small inductance L' and the resulting resonant capacitance C'. If it is considered that both resonances are electromagnetically coupled, the operation of the present resonator can be easily understood.

Figure 18A:
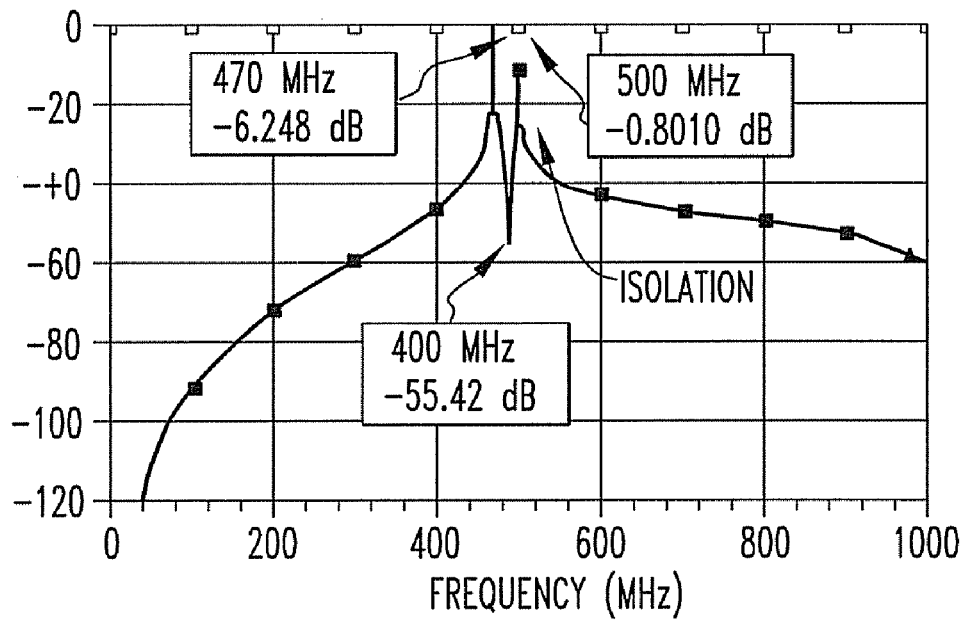
FIGS. 18A, 18B, 18C, and 18D show graphs illustrating the results of analysis of an S parameter in an NMR resonant circuit, according to the present invention.
Figure 18B:
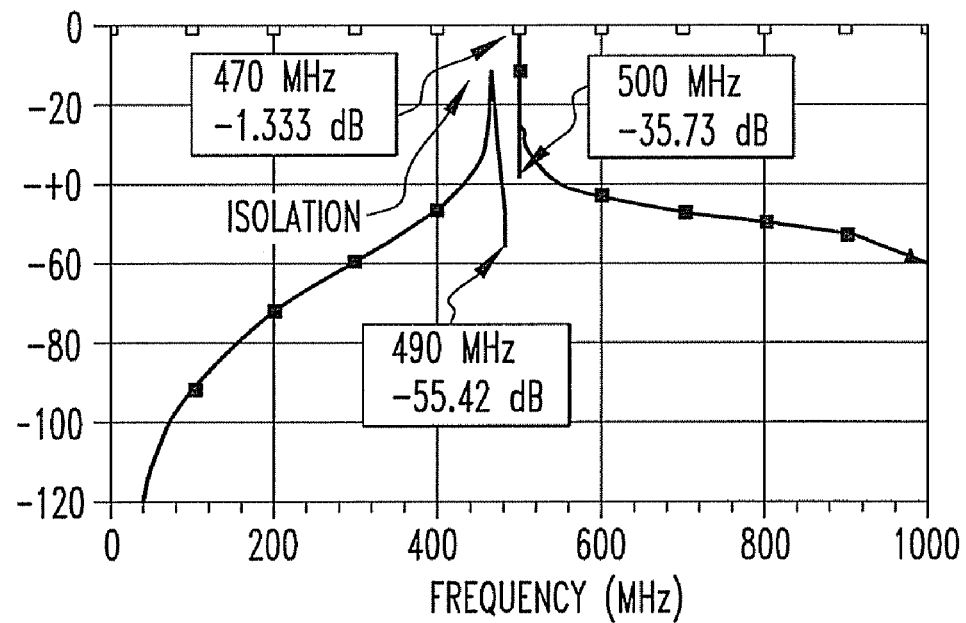

The operation of the RF circuit model shown in FIGS. 8 and 9 is analyzed in detail. Frequency characteristics as shown in FIGS. 18A-18D and a resonant voltage induced across the sample coil are obtained. FIGS. 18A and 18B show the results of an analysis using a network analyzer as a model. Lines drawn downward from the baseline of zero dB on the vertical axis represent reflection characteristics as viewed from ports. The large curves drawn through the whole vertical range and through the whole horizontal range (frequency axis in MHz) indicate pass characteristics between the ports.

Data indicated by straight lines arrayed along the upper side of the graph of FIG. 18A represents reflection characteristics as viewed from port 1 (input-output terminal for $^{19}$F nucleus). It can be seen from the reflection characteristics that matching is made at the resonant frequency of $^{19}$F nucleus and that total reflection is achieved at the resonant frequency of $^1$H nucleus. In the graph, the depth of the dip at 470 MHz is only 6.248 dB, which depends on the data density of the measuring instrument. In practice, there are reflection characteristics more than 40 dB, which correspond to $S_{11}$ in the analysis of the S parameter.

The S parameter is an abbreviation of a scattering parameter that associates waves scattered or reflected by a circuit network with incident waves. The parameter is indicated by $S_{ab}$, which is defined such that a indicates an output port number and b indicates an input port number.

Data indicated by plots taken along the curves in the center of the graph of FIG. 18A indicate the pass characteristics from the port 1 (input-output terminal for $^{19}$F nucleus) to port 2 (input-output terminal for $^1$H nucleus). The data correspond to $S_{21}$ in the analysis of the S parameter. A steeply falling portion at 490 MHz is a frequency (trap frequency) indicating the split frequency $f_0$.

Roughly, from FIGS. 8 and 9, $$f_0 = \frac{1}{2\pi\sqrt{L1C5}}$$

In other notation, $$f_0 = \frac{1}{2\pi\sqrt{L_s1C_s5}}$$

We have found that in the case of the 28-mm square model, for an FH compatible probe for use in a 500 MHz NMR instrument, for example, if the best split frequency $f_0$ is set approximately to a range of about 491±1 MHz, corresponding frequencies are efficiently assigned to the ports. Under this condition, about −10 dB can be secured as the isolation between the input-output port for $^{19}$F nucleus and the input-output port for $^1$H nucleus. Consequently, the level of the crosstalk signal is infinitesimal.

Data indicated by straight lines arrayed along the upper side of the graph of FIG. 18B represents reflection characteristics as viewed from port 2 (input-output terminal for $^1$H nucleus). It can be seen from the reflection characteristics that matching is made at the resonant frequency of $^1$H nucleus and that total reflection is achieved at the resonant frequency of $^{19}$F nucleus. In the graph, the depth of the dip at 470 MHz has a value close to 40 dB, which corresponds to $S_{22}$ in the analysis of the S parameter.

Data indicated by plots taken along the curves in the center of the graph of FIG. 18B indicates the pass characteristics from the port 2 (input-output terminal for $^1$H nucleus) to port 1 (input-output terminal for $^{19}$F nucleus). The data correspond to $S_{12}$ in the analysis of the S parameter. A steeply falling portion at 490 MHz is a frequency (trap frequency) indicating the split frequency $f_0$.

Figure 18C:
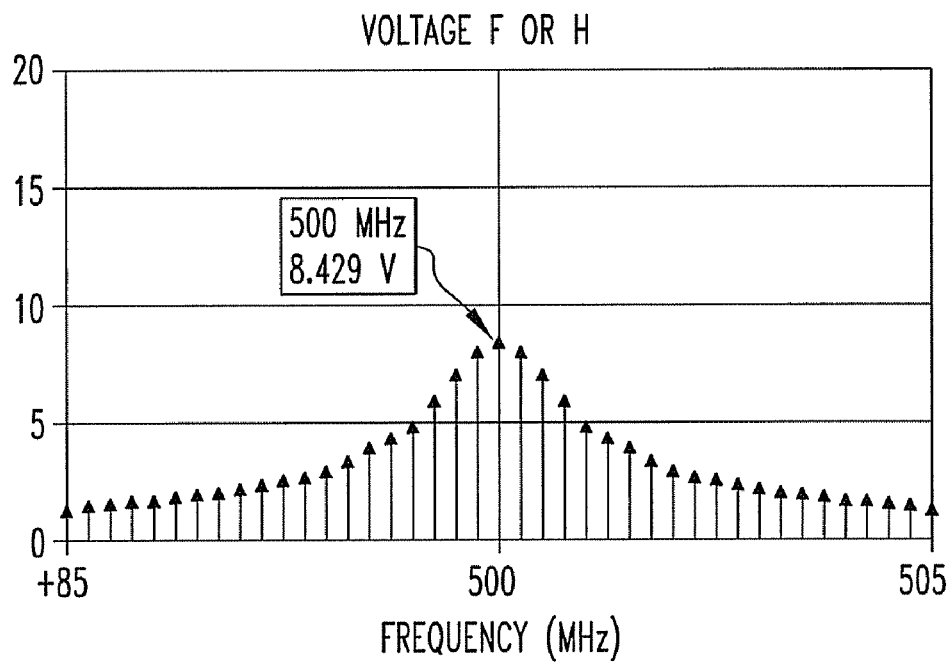
Figure 18D:
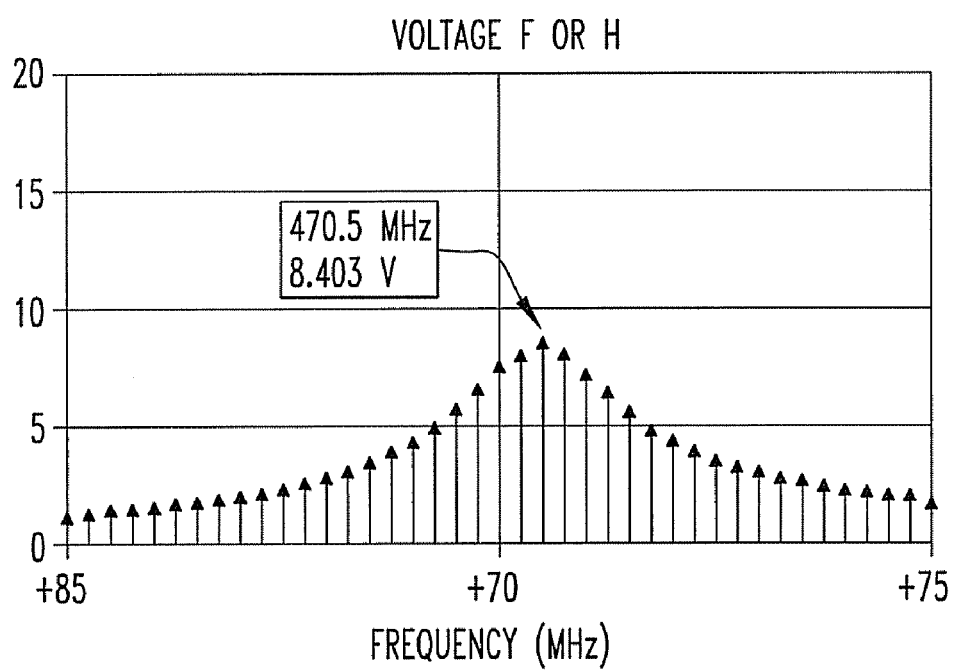

FIGS. 18C and 18D indicate resonant voltages applied across the sample coils if a reference voltage of 1 $V_{p\text{-}p}$ is applied to the ports, respectively. These voltages have been obtained when conditions were set almost optimally, i.e., $V(^{19}F)=V(^1H)$. Because the total voltage of $V(^{19}F)$ and $V(^1H)$ is 16.8 $V_{p\text{-}p}$, if the conditions are so set that emphasis is placed on the $^{19}$F side, the resonant voltages can be assigned at an imbalanced proportion, for example, where $V(^{19}F)=10\ V_{p\text{-}p}$ and $V(^1H)=6.8\ V_{p\text{-}p}$.

In a circuit system showing a maximum voltage under this condition, the resonant voltage is about 11.5 $V_{p\text{-}p}$. Therefore, a sensitivity of about 87% can be expected for $V(^{19}F)$. A sensitivity of about 59% can be expected for $V(^1H)$.

Figure 4A:
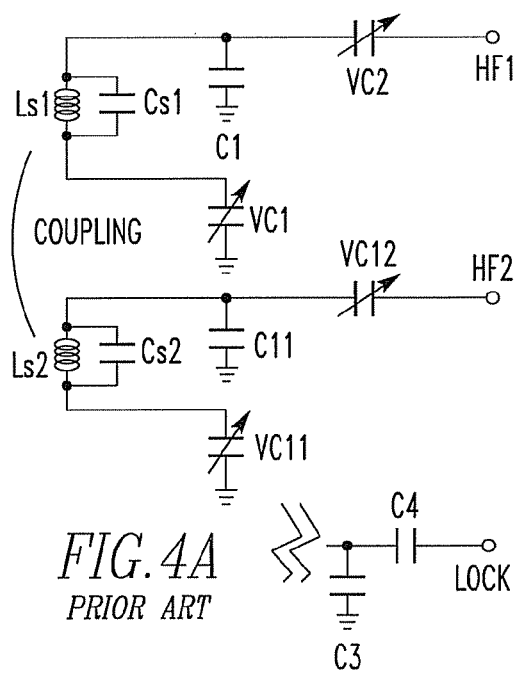
FIGS. 4A, 4B, and 4C show circuit diagrams of another conventional type of NMR resonant circuits.
Figure 4B:
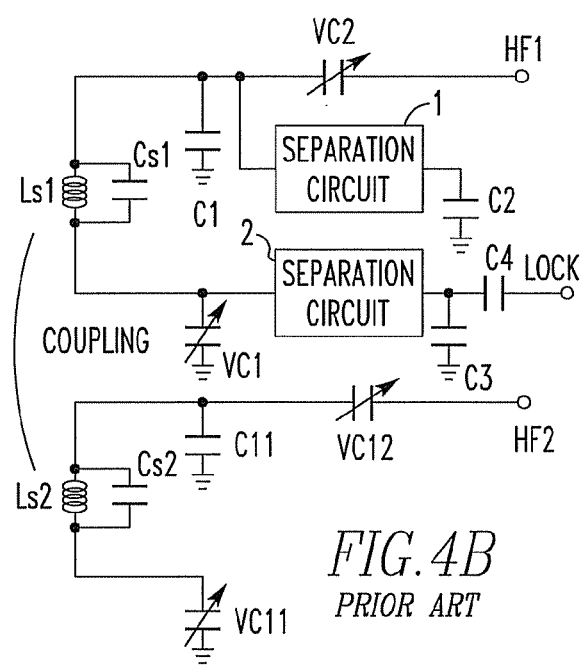
Figure 4C:
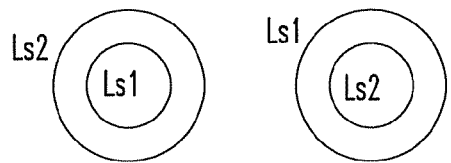

A comparison is made with the prior-art FH compatibility mode technique illustrated in Table 3. A simple method of comparison uses the sum value of $V(^{19}F)+V(^1H)$. The present method is compared with the prior art in terms of absolute sensitivity. In the prior-art technique of FIGS. 4A-4C, the sensitivity is given by $V(^{19}F)+V(^1H)=15.5\ V_{p\text{-}p}$. In the prior-art technique of FIGS. 5A and 5B, the sensitivity is given by $V(^{19}F)+V(^1H)=15.2\ V_{p\text{-}p}$. In the present method, the sensitivity is given by $V(^{19}F)+V(^1H)=16.8\ V_{p\text{-}p}$, which is better than the sensitivities obtained by the conventional methods by about 8% to 11%.

The present method is next compared with the conventional methods in terms of convenience in use of the apparatus. In the prior art of Table 3, either relationship $V(^{19}F) > V(^1H)$ or $V(^1H) > V(^{19}F)$ can be adopted in an inconvenient manner. The sensitivity is different between the modes by a factor of as much as about 1.5 to 2. It can be seen that great restrictions are imposed on the design of the apparatus. In contrast, in the method according to the present invention, wide latitude is allowed in designing the apparatus. When judged from the superiority of application, it is obvious that the present method is superior to the prior art.

In the apparatus according to the present invention, if a mechanism for controlling the split frequency $f_0$ is provided, it is possible, with the probe according to the present invention, to switch the mode of operation between the mode in which $V(^{19}F) > V(^1H)$ and the mode in which $V(^1H) > V(^{19}F)$. The simplest method is to control the capacitance of $C_5$. In the prior art, it is impossible to switch the mode of operation between the mode in which $V(^{19}F) > V(^1H)$ and the mode in which $V(^1H) > V(^{19}F)$. Therefore, separate modes must be prepared for measurements in the two modes. Thus, there is a great difference.

Embodiment 2

Figure 19A:
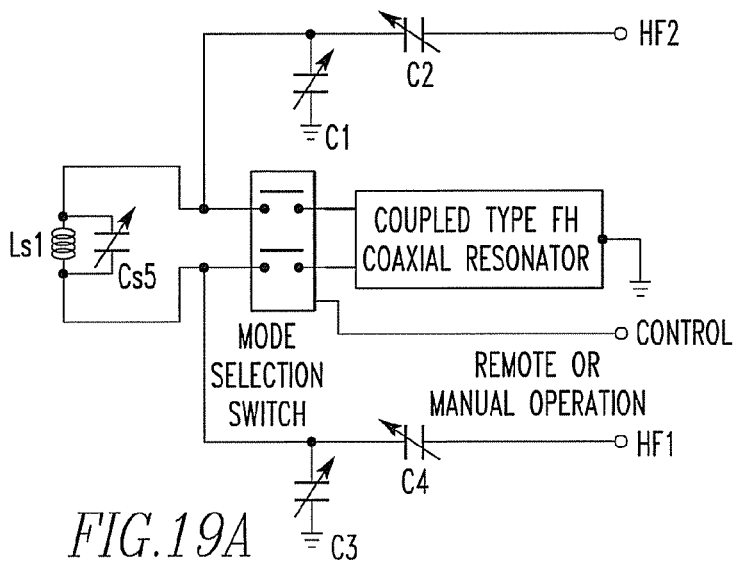
FIGS. 19A, 19B, and 19C show circuit diagrams of other NMR resonant circuits, according to the present invention.

FIG. 19A shows another embodiment of the present invention. In this embodiment, a mode selector switch is mounted between a coupled-type FH coaxial resonator and each end of a sample coil $L_S$ to establish and break the connection between the resonator and the coil.

The resonator of the present embodiment operates as follows by turning on and off the mode selector switch. When the switch is turned on, the FH compatibility performance described so far is selected. When the switch is turned off, measurements can be made at a maximum sensitivity of 100%.

In particular, when HF1 ($^1$H nucleus side) is used at a sensitivity of 100%, C1 or C3 is assigned to the tuning capacitor. C4 is assigned to the matching capacitor. At this time, C2 is set as small as possible to create a high impedance for blocking the HF1 frequency. Consequently, the HF1 frequency is prevented from leaking toward the HF2 side.

Where HF2 ($^{19}$F nucleus side) is used at a sensitivity of 100%, C1 or C3 is assigned to the tuning capacitor, and C2 is assigned to the matching capacitor. At this time, C4 is set as small as possible to create a high impedance for blocking the HF2 frequency. As a consequence, the HF2 frequency is prevented from leaking to the HF1 side.

Figure 19B:
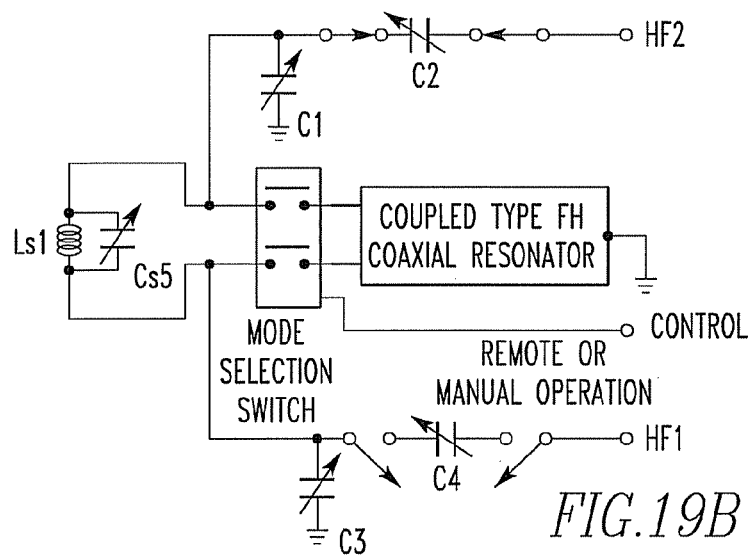

As a modification, both ends of a capacitor (either C2 or C4) on the side where RF radiation should be blocked (in the illustrated example, the HF1 side) are opened by a switching mechanism as shown in FIG. 19B, instead of minimizing the values of C2 and C4.

Figures 1, 2:
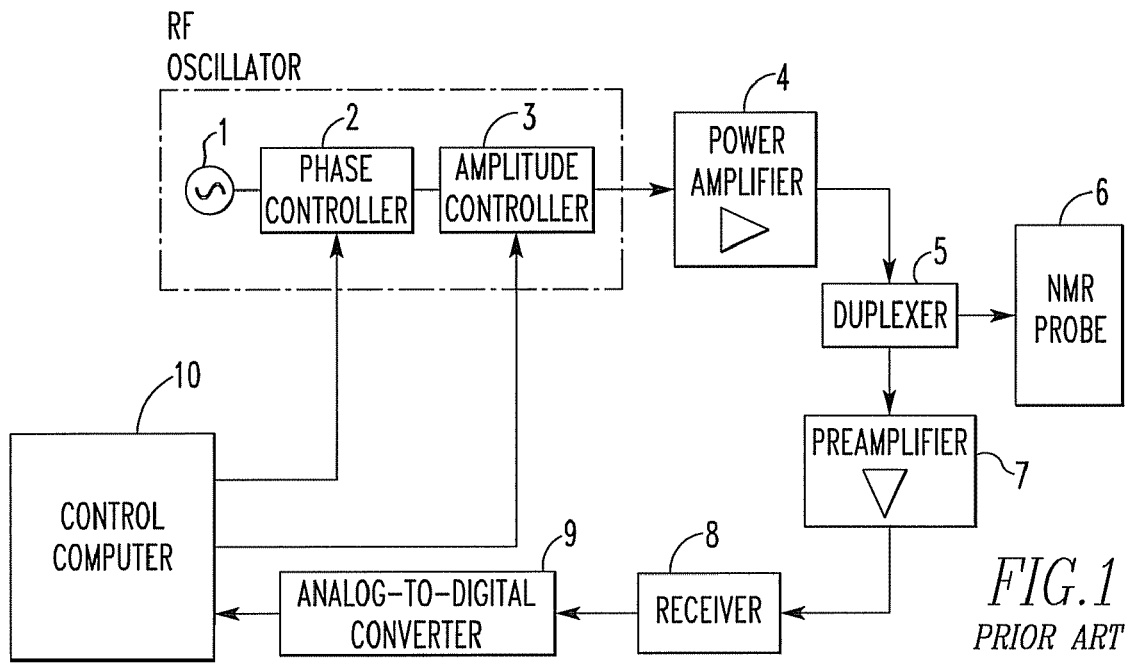
FIG. 1 is a block diagram of one conventional NMR spectrometer.
FIG. 2 is a table of nuclear species investigated by NMR and their resonant frequencies.
Figure 3A:
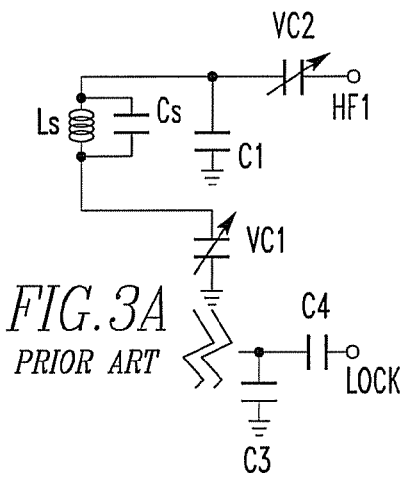
FIGS. 3A and 3B show circuit diagrams of one conventional type of NMR resonant circuits.
Figure 3B:
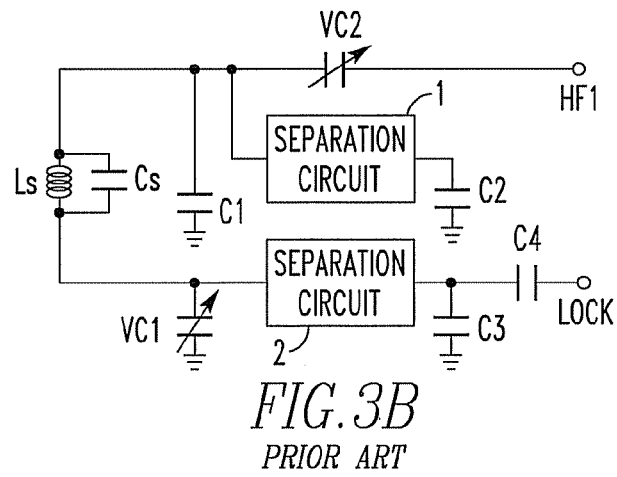

Consequently, a novel FH compatibility probe for measurements can be achieved. This probe acts as the probe of FIGS. 3A-3B permitting measurements at a sensitivity of 100%. The compatibility probe acts also as a probe which is superior in convenience in use to any other conventional FH compatibility mode probe and which permits measurements at a sensitivity of 80%.

Figure 19C:
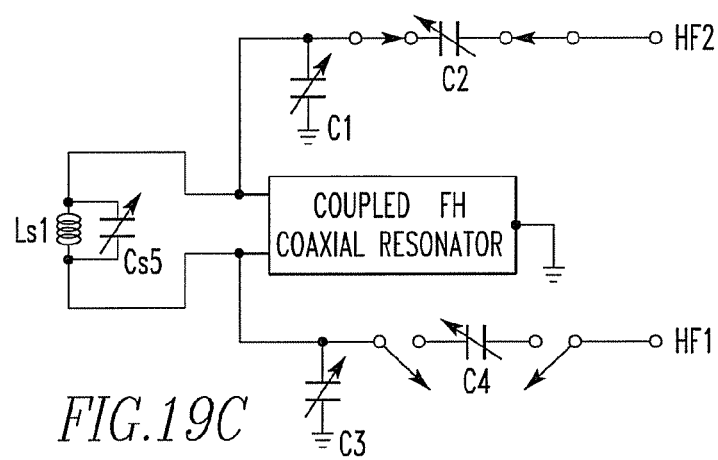

A modification of the resonator shown in FIG. 19B is shown in FIG. 19C, where the mode selector switch for turning on and off the coupled-type HF coaxial resonator is omitted. Double resonance with both $^1$H nucleus and $^{19}$F nucleus is enabled using only a single port for HF1 or HF2. In this case, however, it is obvious that the timings at which RF pulses for $^1$H nucleus and RF pulses for $^{19}$F nucleus are applied must be precisely time-shared.

Embodiment 3

Figure 20:
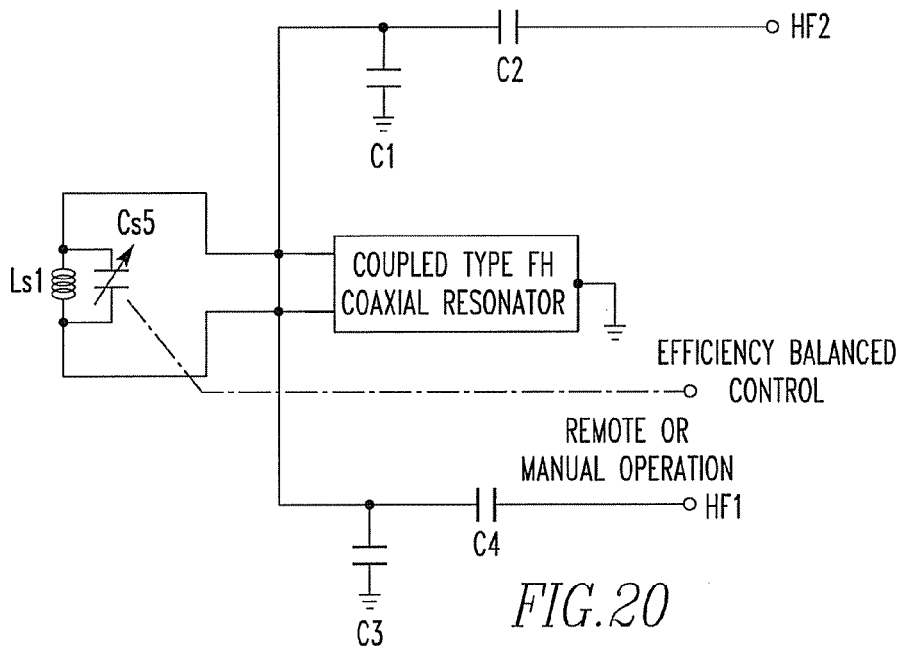
FIG. 20 is a circuit diagram of another NMR resonant circuit, according to the present invention.

FIG. 20 shows an NMR probe according to another embodiment of the present invention. In the present embodiment, there is provided a control mechanism for controlling the capacitive component $C_S$ of a sample coil. Consequently, in the present embodiment, only a single probe is used, and the mode of operation can be switched between a mode where $V(^{19}F)>V(^1H)$ and another mode where $V(^1H)>V(^{19}F)$.

When the probe is used in the mode where $V(^{19}F)>V(^1H)$, if CS5 under the condition where $V(^{19}F)=V(^1H)$ holds is replaced by $C_S5\#$, the relationship between $C_S5$ and $C_S5\#$ obtained after the control is so adjusted that the relationship $C_S5>C_S5\#$ holds. A capacitance of 0.1 pF is converted into a resonant voltage of 1 $V_{p-p}$ when a maximum voltage of 11.5 $V_{p-p}$ is obtained. The scale is graduated, for example, in steps of 0.02 pF. Thus, the balanced condition between $V(^{19}F)$ and $V(^1H)$ can be varied in steps of 0.2 $V_{p-p}$.

When the probe is used in the mode where $V(^1H)>V(^{19}F)$, if $C_S5$ under the condition where $V(^{19}F)=V(^1H)$ holds is replaced by $C_S5\#$, the relationship between $C_S5$ and $C_S5\#$ obtained after the control is so adjusted that the relationship $C_S5<C_S5\#$ holds. A capacitance of 0.1 pF is converted into a resonant voltage of 1 $V_{p-p}$ when a maximum voltage of 11.5 $V_{p-p}$ is obtained. The scale is graduated, for example, in steps of 0.02 pF. Thus, the balanced condition between $V(^{19}F)$ and $V(^1H)$ can be varied in steps of 0.2 $V_{p-p}$.

Embodiment 4

Figure 21:
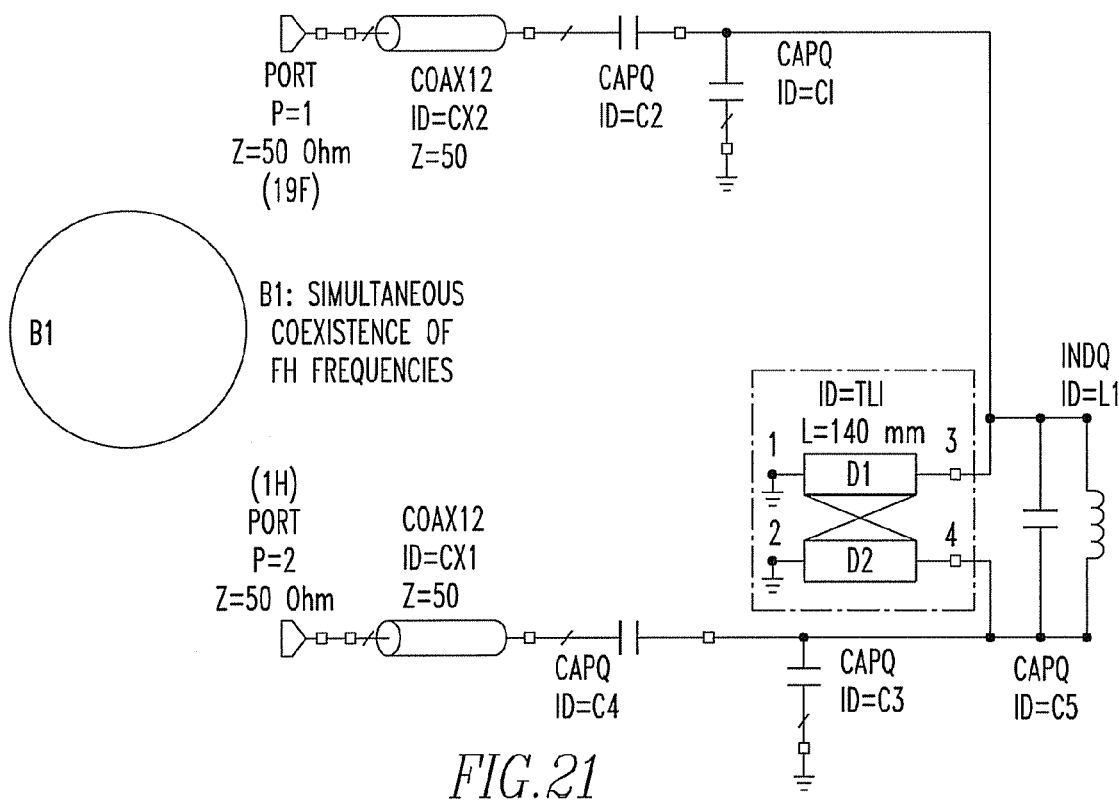
FIG. 21 is a circuit diagram of a further NMR resonant circuit, according to the present invention.
Figure 22:
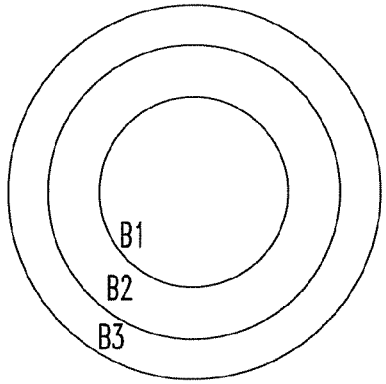
FIG. 22 illustrates still another NMR resonant circuits, according to the present invention.
Figure 22:
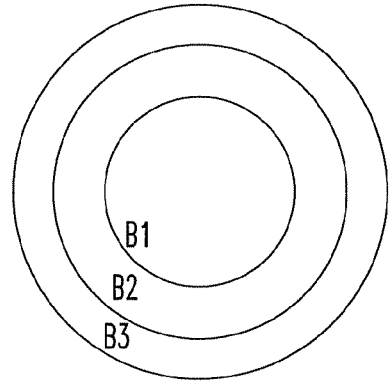

An NMR probe according to the present embodiment is shown in FIG. 21. The probe has a single sample coil bobbin on which a sample coil is wound. Other NMR probes according to the present embodiment are shown in FIG. 22, where sample coils are wound on two or three sample coil bobbins.

In examples where there are two or three sample coils, the sample coils are arranged concentrically. The axes of RF magnetic fields produced by the adjacent sample coils when in resonance are rectangular to each other.

HF (double resonance at the resonant frequency of $^{19}$F nucleus and resonant frequency of $^1$H nucleus) is assigned to one of the sample coils. Single or multiple resonance at LF or lock frequency is assigned to the other sample coil or coils.

As can be seen from these examples, whether there is only one sample coil or there are plural sample coils, if the present invention shown as Embodiments 1-3 is applied to one sample coil, an NMR probe can be built which permits compatibility of the resonant frequency of $^{19}$F nucleus and the resonant frequency of $^1$H nucleus.

Embodiment 5

In Embodiment 1, the outer box of the coupled-type FH coaxial resonator 12 is made of a hollow tubular body having a rectangular cross section. The cross section of the tubular body is not limited to a rectangular form. For example, the cross section may also assume a polygonal form other than a rectangular form, a circular form, or an elliptical form.

Embodiment 6

In Embodiment 1, the length of the outer box of the coupled-type FH coaxial resonator 12 and the length of the rod electrodes mounted inside the box are set substantially to a quarter wavelength. The lengths may also be (2n−1) times a quarter wavelength, where n is a natural number.

Embodiment 7

In Embodiment 1, the length of the outer box of the coupled-type FH coaxial resonator 12 and the length of the rod electrodes mounted inside the box are set substantially to a quarter wavelength. The lengths may also be 2n times a quarter wavelength, where n is a natural number. In this case, it is desired that both ends (positions corresponding to antinodes of RF radiation) of the outer box of the coupled-type FH coaxial resonator 12 be open ends and that the positions corresponding to the nodes of RF radiation be grounded points on the rod electrodes.

The present invention can find wide use in NMR measurements in cases where it is necessary to resonate a probe with the resonant frequency of $^{19}$F nucleus and, at the same time, with the resonant frequency of $^1$H nucleus.

Having thus described our invention with the detail and particularity required by the Patent Laws, what is desired protected by Letters Patent is set forth in the following claims.

The invention claimed is:

1. An NMR probe comprising:
   a sample coil having two ends A and B;
   a hollow tubular body formed by a conductive wall at ground potential, the tubular body having one wall surface having an open portion; and
   two rod electrodes disposed inside the hollow tubular body substantially in a parallel relationship to each other axially of the tubular body,
   wherein respective one ends of the two rod electrodes are connected with the ends A and B, respectively, of the sample coil through the open portion, while other ends of the rod electrodes are electrically grounded to the hollow tubular body at a wall surface located opposite to the wall surface having the open portion,
   wherein an RF input-output port corresponding to a resonant frequency of $^1$H nucleus is connected with the end A of the sample coil via a tuning and matching device, and
   wherein another RF input-output port corresponding to a resonant frequency of $^{19}$F nucleus is connected with the end B of the sample coil via another tuning and matching device.

2. An NMR probe as set forth in claim 1, wherein said rod electrodes are substantially (2n−1) times as long as a quarter wavelength of resonating RF radiation, where n is a natural number.

3. An NMR probe comprising:
   a sample coil having two ends A and B;
   a hollow tubular body formed by a conductive wall at ground potential, the tubular body having two opposite wall surfaces each having an open portion; and
   two rod electrodes disposed inside the hollow tubular body substantially in a parallel relationship to each other axially of the tubular body,
   wherein respective one ends of the two rod electrodes are connected with the ends A and B, respectively, of the sample coil via one of the open portions, while other ends of the electrodes are made open at the other open portion,
   wherein an RF input-output port corresponding to a resonant frequency of $^1$H nucleus is connected with the end A of the sample coil via a tuning and matching device, and wherein another RF input-output port corresponding to a resonant frequency of $^{19}$F nucleus is connected with the end B of the sample coil via another tuning and matching device.

4. An NMR probe as set forth in claim 1, wherein said rod electrodes are substantially 2n times as long as a quarter wavelength of resonating RF radiation, where n is a natural number.

5. An NMR probe as set forth in claim 1 or 3, wherein the rod electrode connected with the end A is thicker than the rod electrode connected with the end B.

6. An NMR probe as set forth in claim 1 or 3, wherein the two rod electrodes connected with the two ends A and B, respectively, of the sample coil are designed to be capable of freely establishing and breaking connection between the ends A and B.

7. An NMR probe as set forth in claim 1 or 3, wherein said sample coil has a capacitive component, and wherein the ratio of detection sensitivity on an RF side corresponding to the resonant frequency of $^{1}$H nucleus to detection sensitivity of an RF side corresponding to the resonant frequency of $^{19}$F nucleus can be varied by controlling magnitude of the capacitive component.

8. An NMR probe as set forth in claim 1 or 3, wherein additional sample coils are arranged concentrically around the first-mentioned sample coil, and wherein the additional sample coils can resonate with an LF frequency or with a lock frequency.

9. An NMR probe as set forth in claim 1 or 3, wherein said hollow tubular body has a polygonal cross section having an inside dimension substantially equal to or less than an inside diameter of an assembly consisting of a superconducting NMR magnet and room temperature shims mounted in bores formed in the magnet.

10. An NMR probe as set forth in claim 1 or 3, wherein said hollow tubular body has a circular cross section having an inside dimension substantially equal to or less than an inside diameter of an assembly consisting of a superconducting NMR magnet and room temperature shims mounted in bores formed in the magnet.

11. An NMR probe as set forth in claim 1 or 3, wherein said hollow tubular body has an elliptical cross section having an inside dimension substantially equal to or less than an inside diameter of an assembly consisting of a superconducting NMR magnet and room temperature shims mounted in bores formed in the magnet.

* * * * *